United States Patent [19]
Bergman

[11] Patent Number: 5,370,741
[45] Date of Patent: Dec. 6, 1994

[54] DYNAMIC SEMICONDUCTOR WAFER PROCESSING USING HOMOGENEOUS CHEMICAL VAPORS

[75] Inventor: Eric J. Bergman, Kalispell, Mont.

[73] Assignee: Semitool, Inc., Kalispell, Mont.

[21] Appl. No.: 978,929

[22] Filed: Nov. 18, 1992

Related U.S. Application Data

[63] Continuation of Ser. No. 665,609, Mar. 6, 1991, abandoned, and a continuation-in-part of Ser. No. 526,057, May 21, 1990, Pat. No. 5,238,500, and Ser. No. 526,052, May 21, 1990, abandoned, which is a continuation-in-part of Ser. No. 524,239, May 15, 1990, abandoned.

[51] Int. Cl.$^5$ .............................................. H01L 21/00
[52] U.S. Cl. .............................................. 134/3; 134/31; 156/646; 156/662
[58] Field of Search ............... 134/3, 31; 437/238, 437/225; 156/639, 643, 646, 662

[56] References Cited

U.S. PATENT DOCUMENTS

| | | | |
|---|---|---|---|
| 5,044,314 | 9/1991 | McNeilly | 156/345 |
| 5,078,832 | 1/1992 | Tanaka | 156/640 |
| 5,169,408 | 12/1992 | Biggerstaff et al. | 156/646 |
| 5,174,855 | 12/1992 | Tanaka | 156/626 |
| 5,248,380 | 9/1993 | Tanaka | 156/646 |

OTHER PUBLICATIONS

Mereau et al., "Wafer Cleaner System", IBM Tech. Disc. Bull. vol. 14, No. 10, Mar. 1972 pp. 2905–2906.

Primary Examiner—Thi Dang
Attorney, Agent, or Firm—Wells, St. John, Roberts, Gregory & Matkin

[57] ABSTRACT

Disclosed are methods and apparatuses for improved processing of semiconductor wafers and the like using processing chemicals, particularly hydrofluoric acid (HF) and water mixtures. Homogeneous vapor mixtures are generated from homogeneous liquid phase mixtures which are preferably recirculated, mixed and agitated. The liquid phase is advantageously circulated through a chemical chamber within the processing bowl. Exposure of wafers to vapors from the chemical chamber can be controlled by a vapor control valve which is advantageously the bottom of the processing chamber. The wafer is rotated or otherwise moved within the processing chamber to provide uniform dispersion of the homogeneous reactant vapors across the wafer surface and to facilitate vapor circulation to the processed surface. A radiative volatilization processor can be utilized to volatilize reaction by-products which form under some conditions. The processes provide efficient uniform etching with low particle count performance.

69 Claims, 19 Drawing Sheets

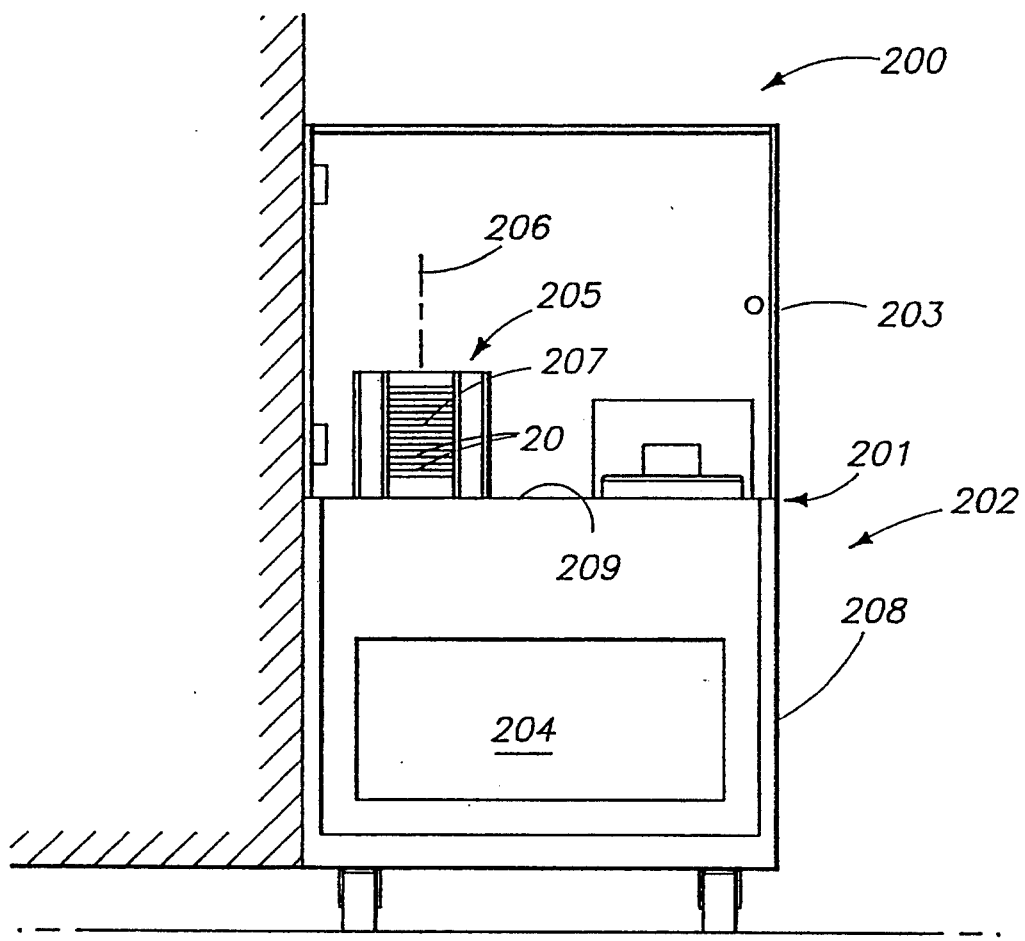
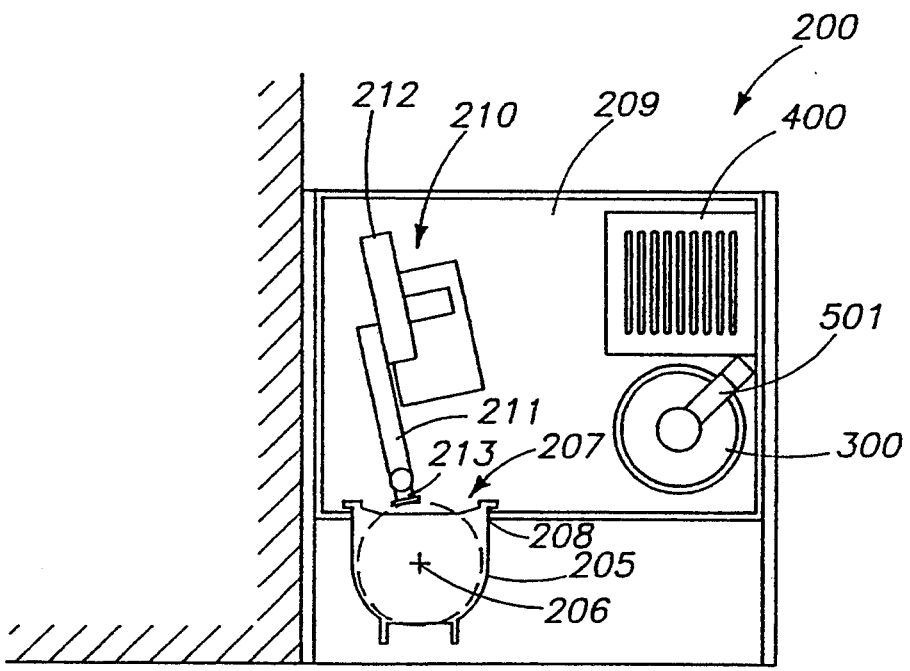

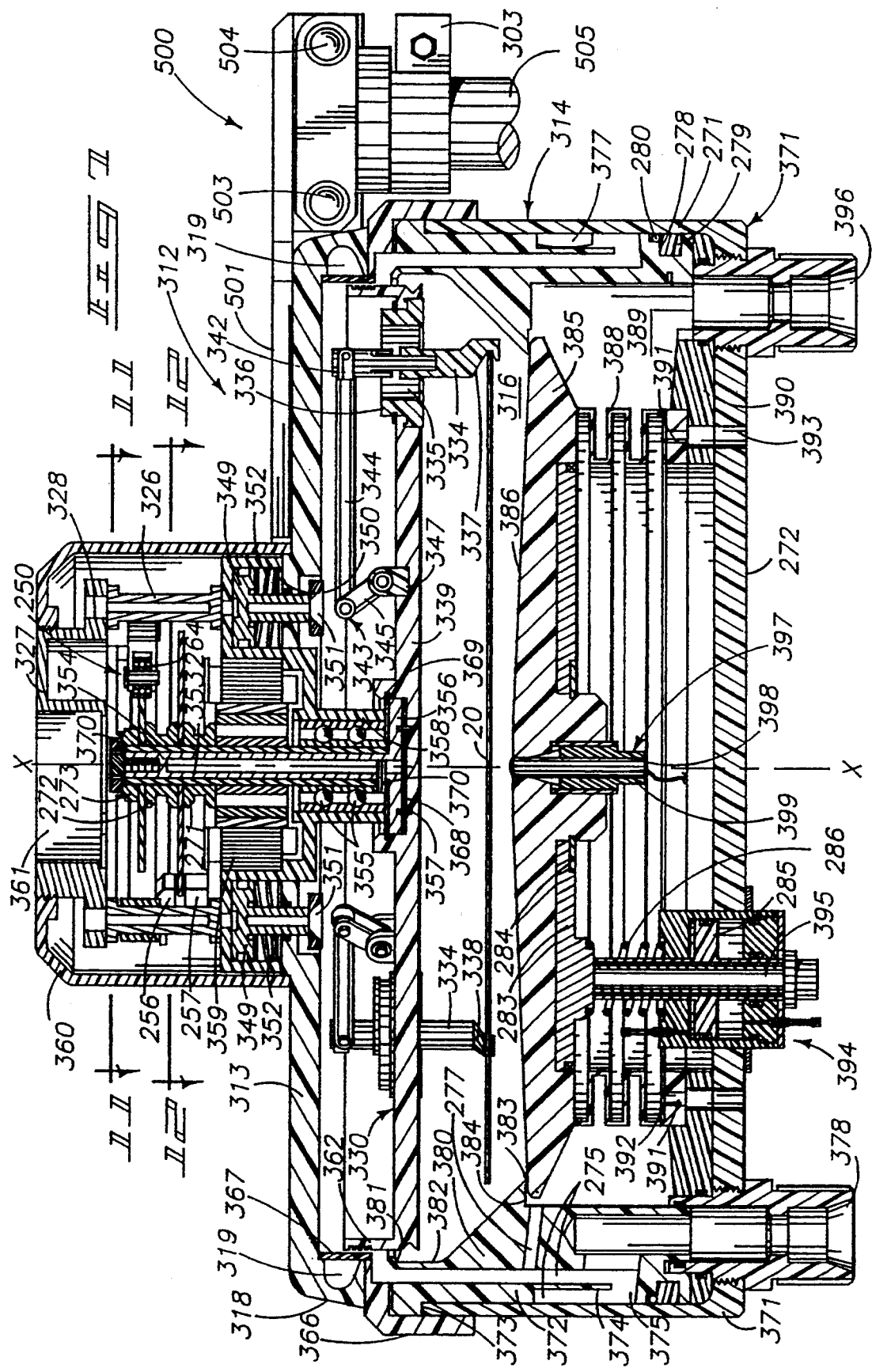

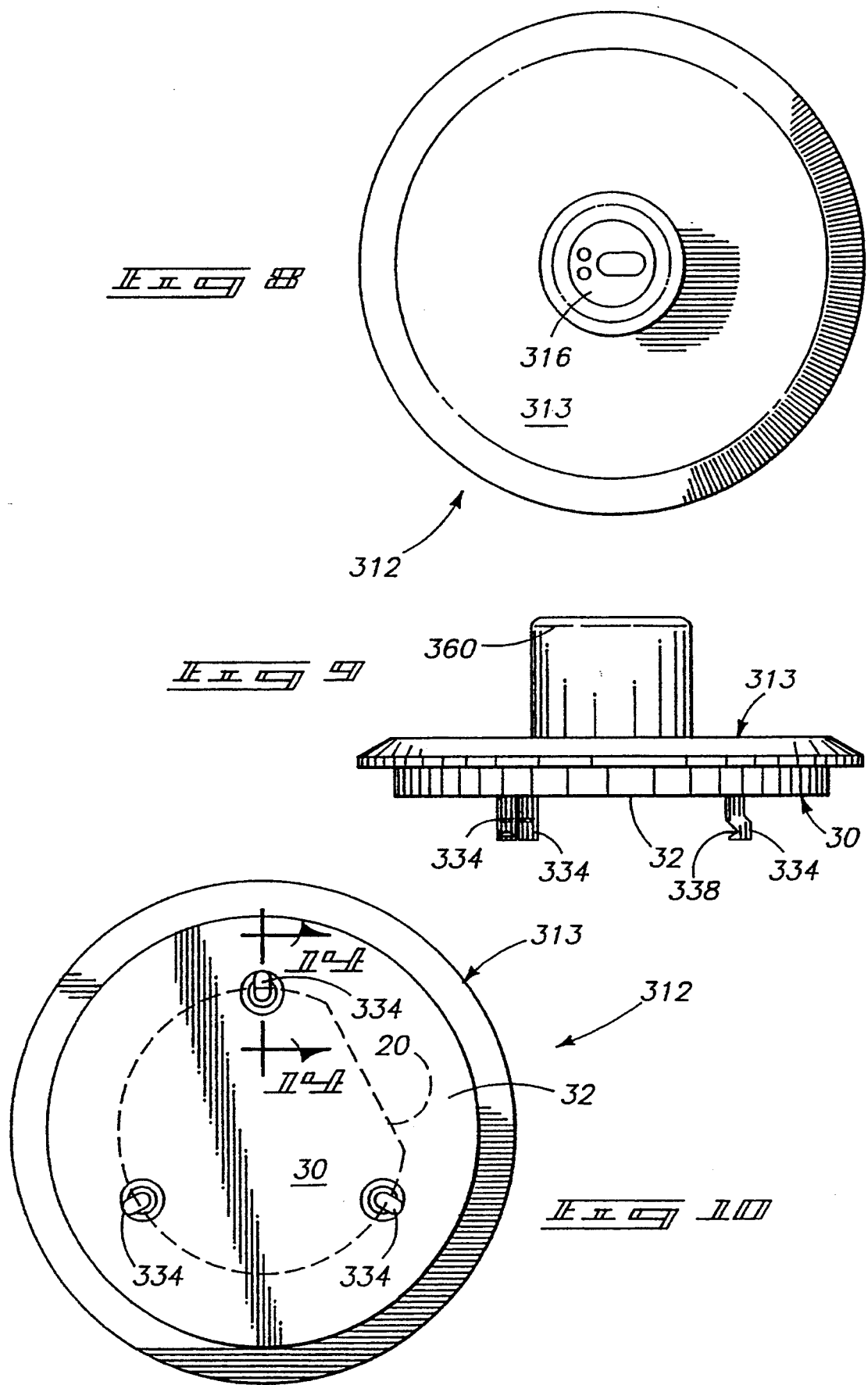

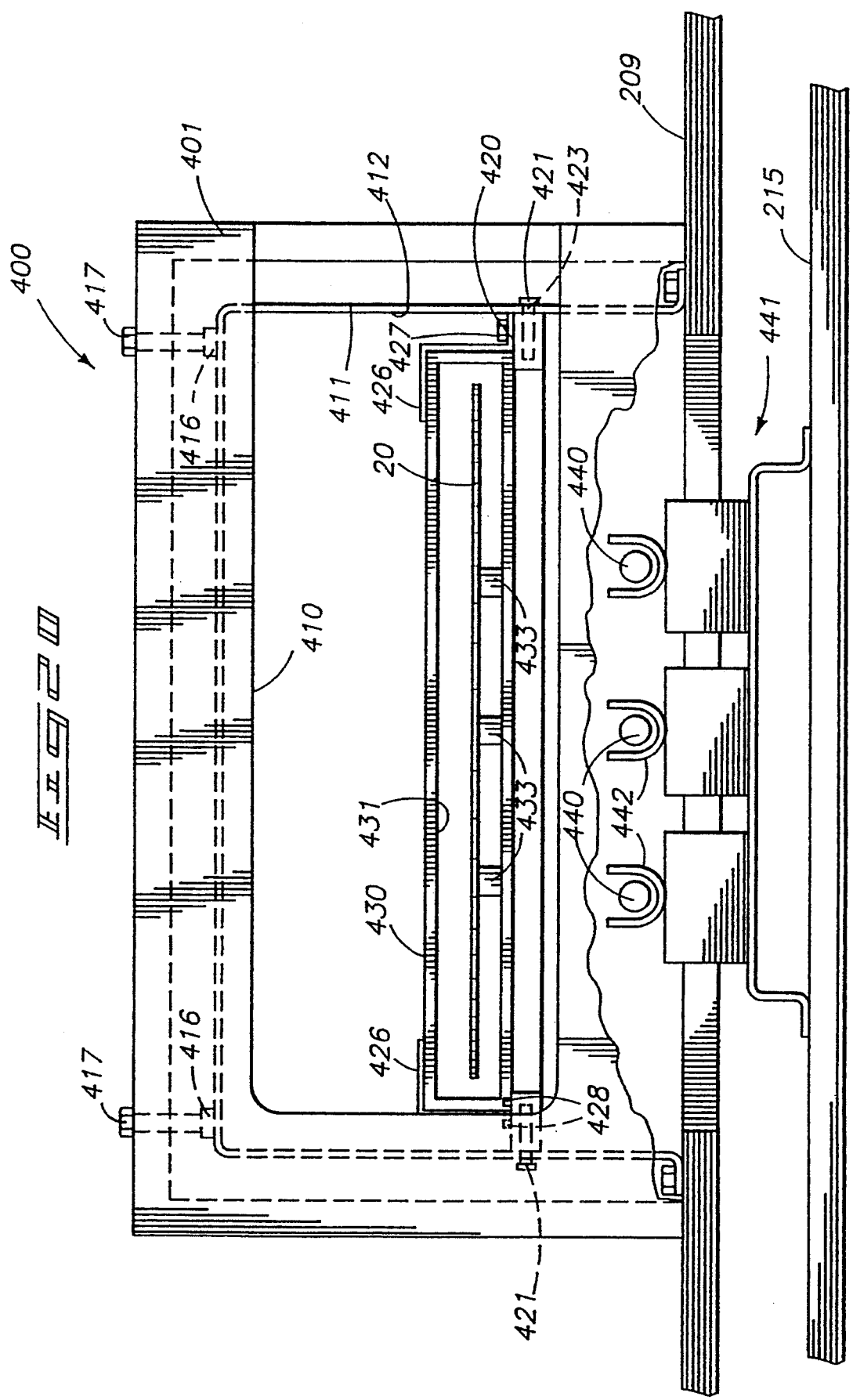

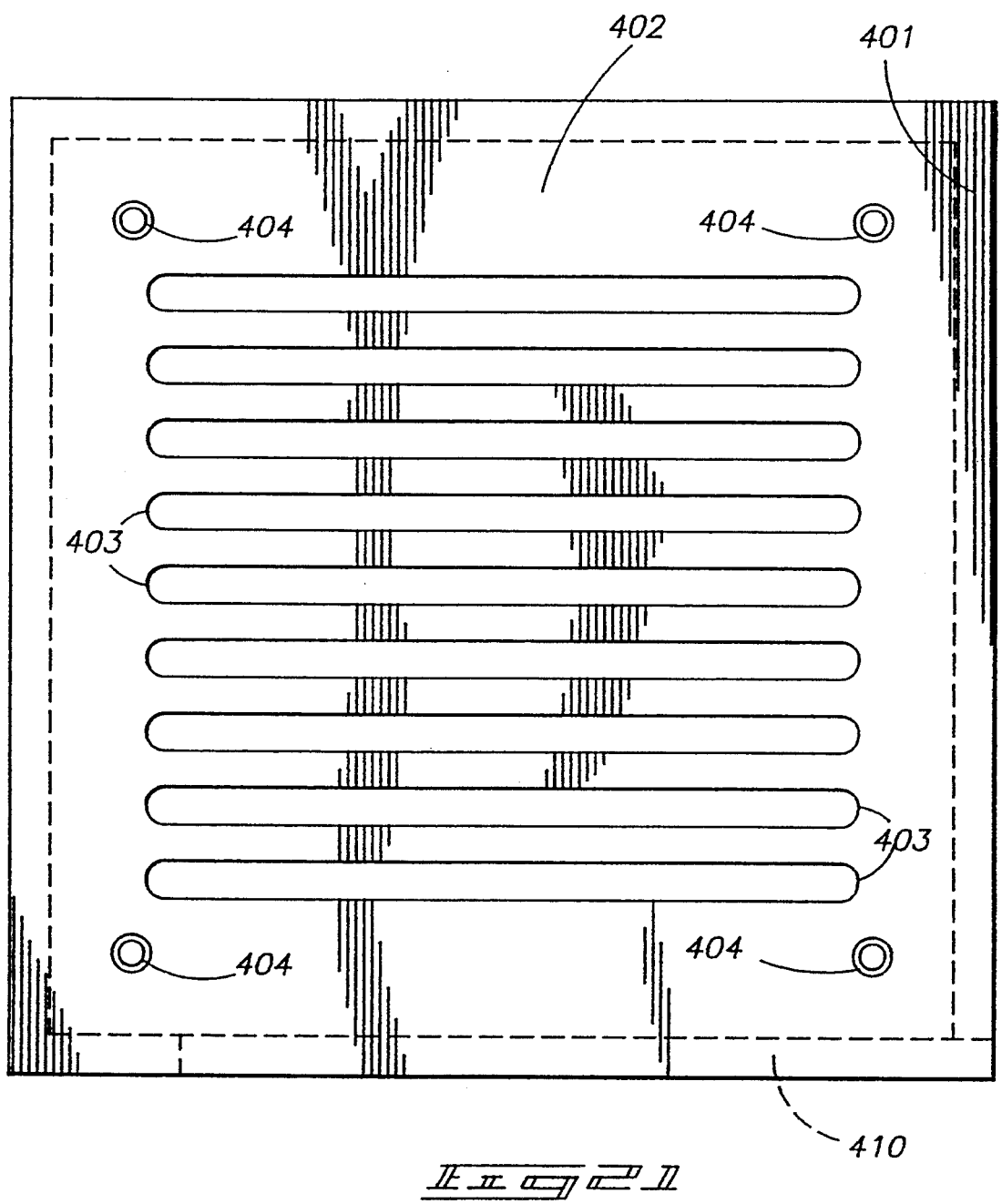

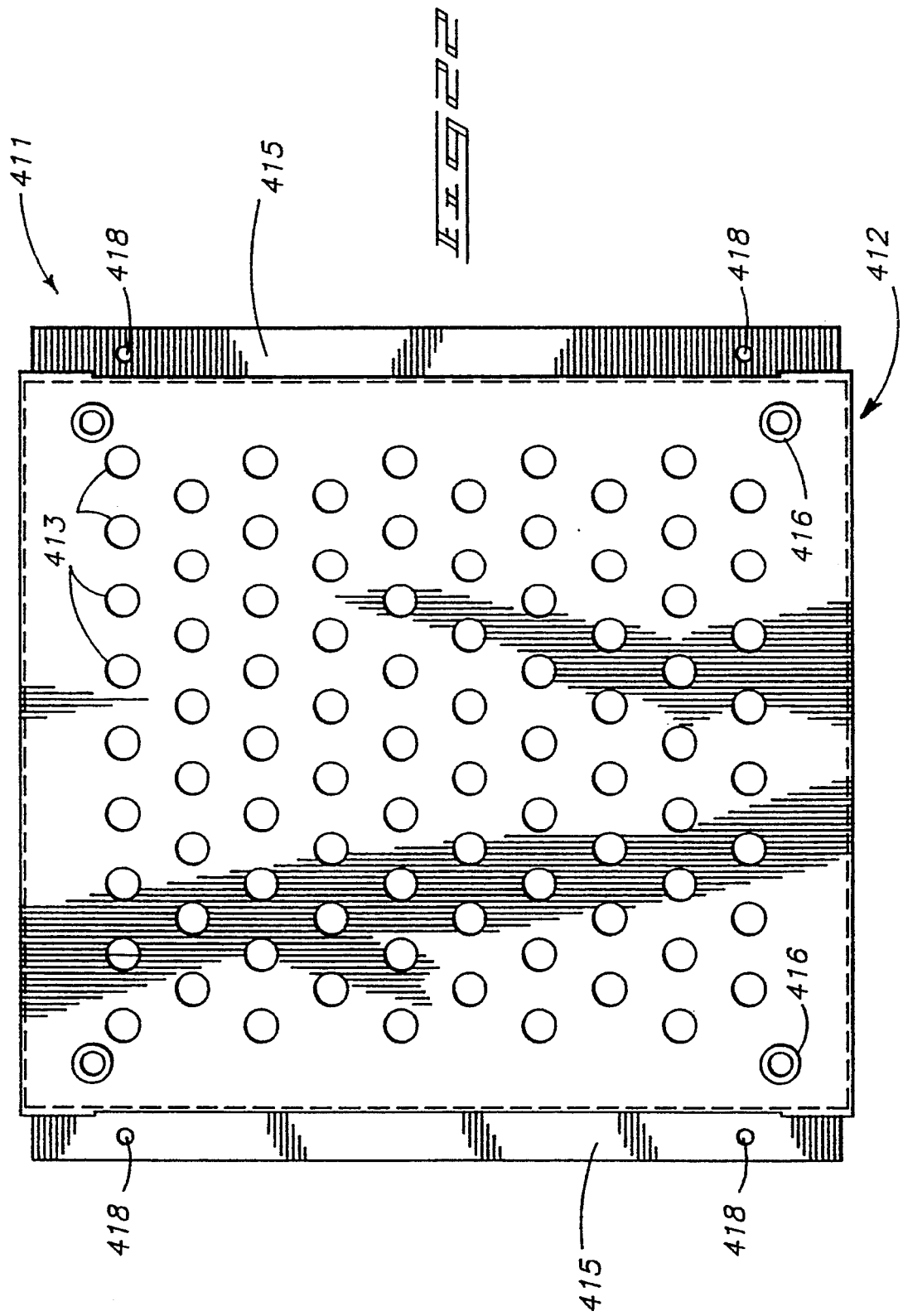

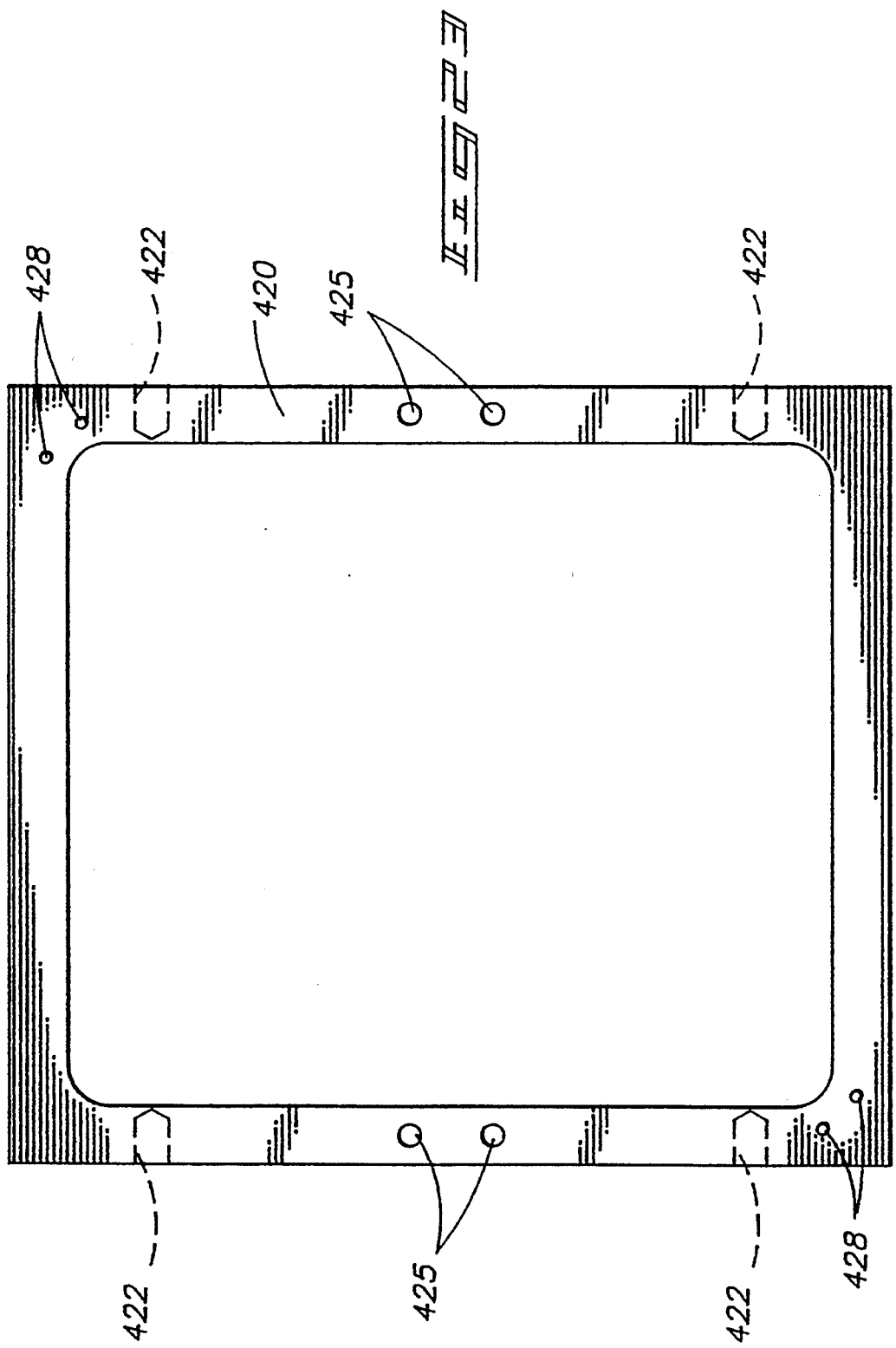

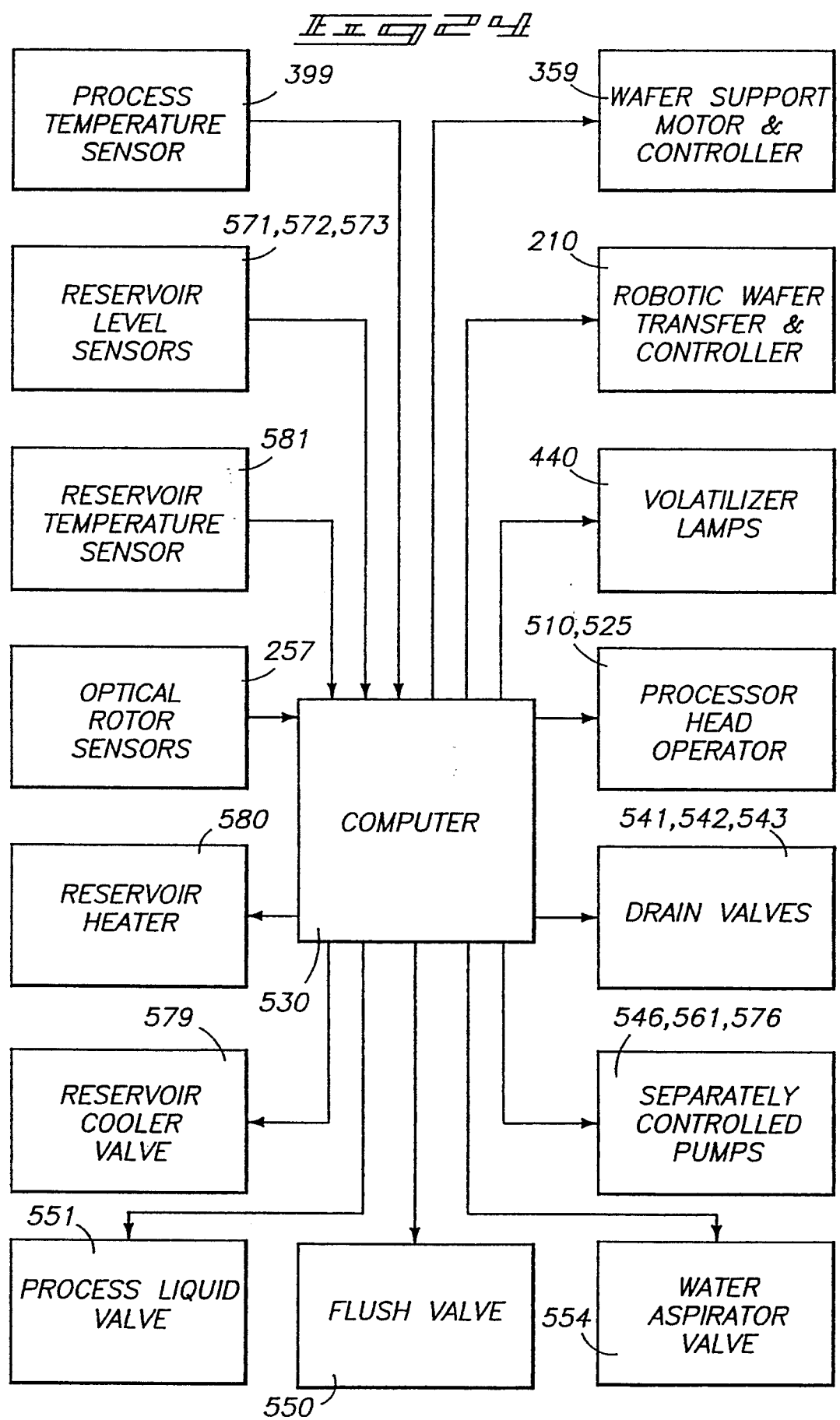

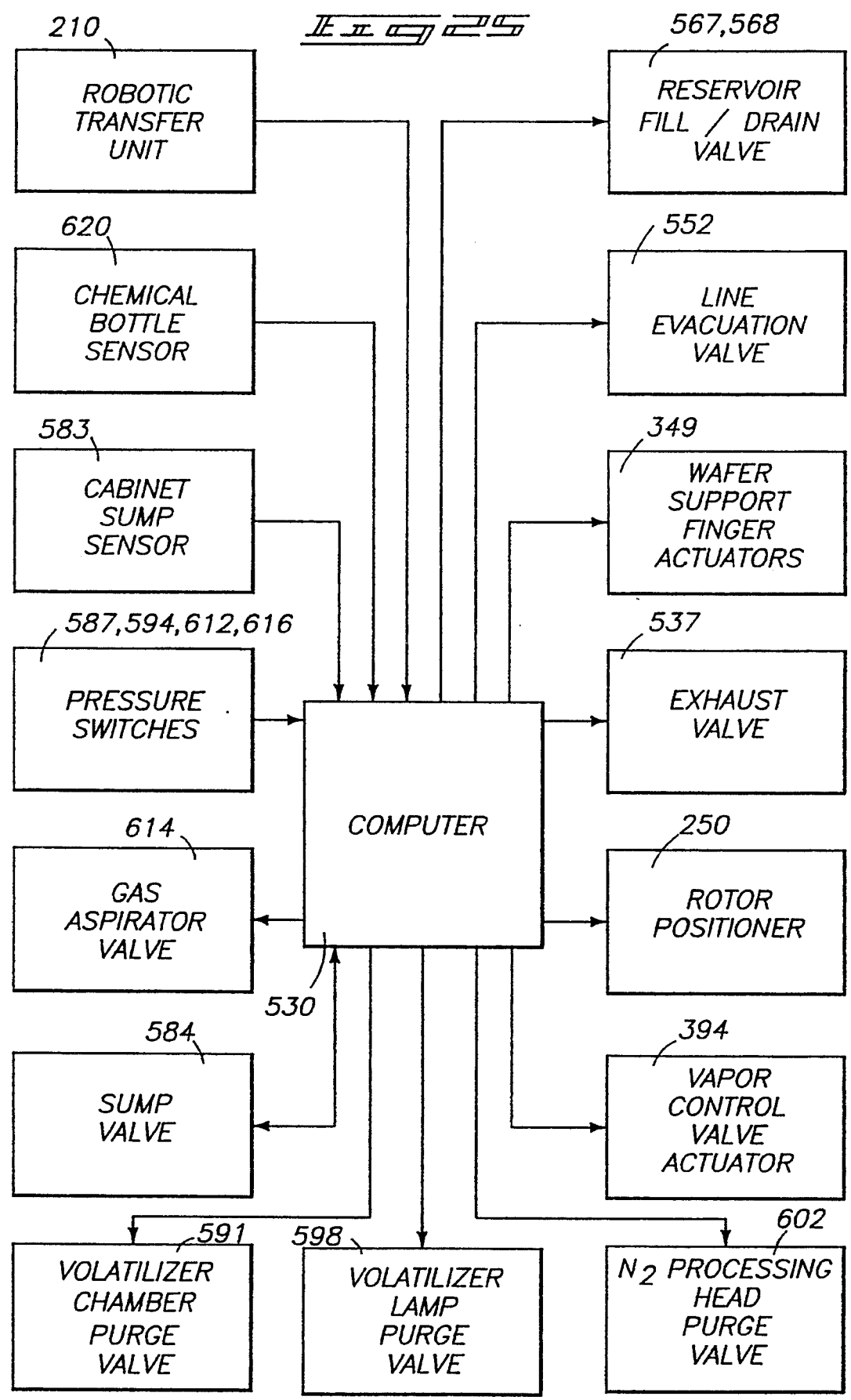

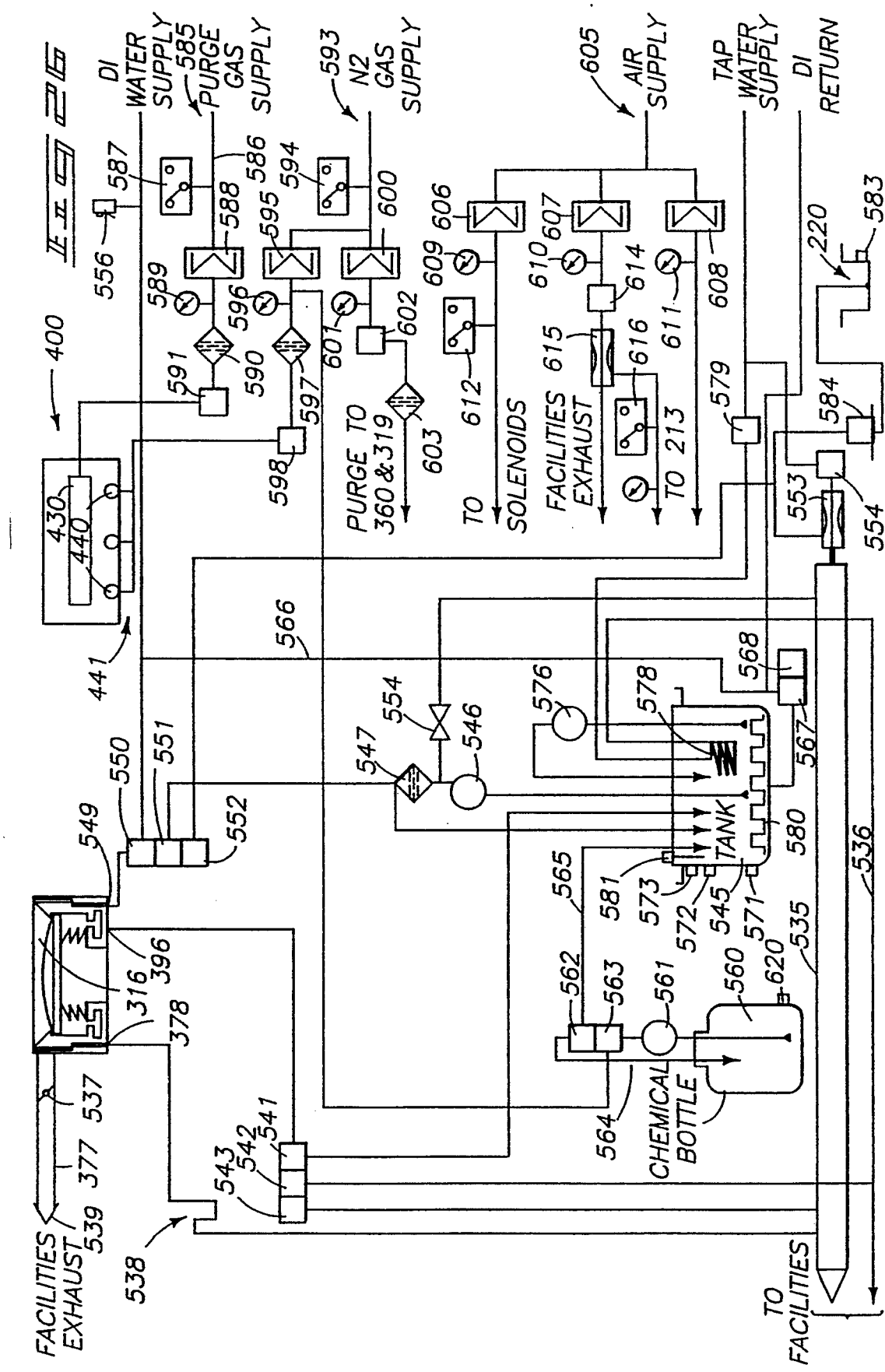

DYNAMIC SEMICONDUCTOR WAFER PROCESSING USING HOMOGENEOUS CHEMICAL VAPORS

This is a continuation-in-part of U.S. patent application Ser. No. 07/526,052, filed May 21, 1990, now abandoned, entitled "Aqueous Hydrofluoric Acid Vapor Etching of Semiconductor Wafers", which was a continuation-in-part of U.S. patent application Ser. No. 07/524,239, filed May 15, 1990, now abandoned, entitled "Aqueous Hydrofluoric Acid Vapor Etching of Semiconductor Wafers" (now abandoned).

This is also a continuation-in-part of U.S. patent application Ser. No. 07/526,057, filed May 21, 1990, now U.S. Pat. No. 5,238,500, entitled "Aqueous Hydrofluoric and Hydrochloric Acid Vapor Processing of Semiconductor Wafers".

This is a continuation of copending U.S. patent application Ser. No. 07/665,609 filed Mar. 6, 1991, now abandoned.

Priority is claimed with respect to such applications and such applications are hereby incorporated by reference.

TECHNICAL FIELD

The technical field of this invention is vapor phase processes for semiconductor wafers and similar articles using aqueous hydrofluoric acid or other appropriate reactants.

BACKGROUND OF THE INVENTION

It is common in the processing of silicon semiconductor wafers to remove or etch portions of a layer of silicon dioxide using an etchant. A common etchant is hydrofluoric acid. This is typically done using an immersion process wherein a wafer, or one or more carriers containing a number of wafers, are immersed in the desired hydrofluoric acid containing processing fluid.

One of the disadvantages of immersion etching processes is that the wafers typically exhibit an increase in the numbers of particulates which become adhered to or imbedded in the wafer. As the feature size of semiconductor wafers continues to decrease into the submicron sizes, now typically in the range of 0.1–0.5 micron, the need for minimizing contamination becomes even more acute. These small feature sizes also create additional problems for immersion processing because surface tension effects can reduce etching uniformity and resulting product quality.

It has previously been recognized that silicon wafers can be processed by using etchant gases, including gases which contain hydrofluoric acid (HF). In an article entitled, "Etching of Thin $SiO_2$ Layers Using Wet HF Gas" authors P. A. M. van der Heide et al., describe the etching of silicon dioxide layers by using vapor mixtures of HF, water and nitrogen. The article describes using a flow of nitrogen carrier gas through a vessel containing a 10% hydrofluoric aqueous solution. The nitrogen carrier produced a flow of etchant gas which was directed through a nozzle against the surface of a small silicon wafer being etched. A flow of dry nitrogen was passed over the opposite side of the wafer to reduce the effects of ambient atmospheric water which was present in the essentially open atmospheric process. Temperatures from 25°–40° C. were indicated for the HF solution and from 25° C. to about 60° C. for the wafer. The authors also reported that high temperature treatment under vacuum conditions following the etch provided complete removal of oxygen.

One deficiency of the process described is the continuation of etching after the intended process exposure period has finished. This results in uneven etching rates and problems in the resulting integrated circuit devices due to variations in feature sizes across the device. Etching uniformity is also deficient in that the process arrangement may not provide assurance of homogeneous presentation of the reactant gas to the wafer being processed. Variations in the uptake of the vapors by the incoming carrier gas stream can result in instantaneous variations in the etchant gas stream which can affect processing. This deficiency may not have been as significant in the reported processing because of the substantial diluting effect of the carrier gas which also resulted in very slow etching rates.

Another serious deficiency of the processing described by van der Heide is that the etching rates are very slow and accordingly not practical from a commercial processing standpoint where high volume production rates must be maintained. Therein the authors describe the need to produce an initial wetting time and then periods of 3.5–5 minutes were reported as acceptable for removing very thin layers of only 1.2–3.5 nanometers. The resulting indicated etching rates were about 1 minute per nanometer (1 minute per 10 Angstroms). These relatively slow etching rates would provide commercially unfeasible processing times of 5–100 minutes where layers of 50–1000 Angstroms are to be removed. Such processing times are sufficiently slow to prevent acceptance of the van der Heide vapor processing as a substitute to the faster processing times possible using the prevalent immersion processing.

U.S. Pat. No. 4,749,440 to Blackwood et al. shows a gaseous process for removing films from substrates which utilizes an anhydrous HF supply. The process is described to involve passing a flow of dry nitrogen over the wafer and then introducing a flow of reactive gas which is preferably an anhydrous hydrogen halide gas such as anhydrous hydrogen fluoride gas. A flow of water vapor laden nitrogen is also passed over the wafer before the anhydrous HF gas flow is begun and this is continued until after the anhydrous HF gas flow has been stopped. This type of processing leads to nonhomogeneous mixing occurring during the brief processing period of approximately 5–30 seconds. During the initial period exclusively water laden carrier gas is first introduced. This subjects the surface of the wafer to a high gradient moisture increase over a very short period of time. This is immediately followed by anhydrous HF gas which is incapable of reaching any effectively uniform homogeneous or equilibrium condition with the water vapor because of the prior introduction of the water vapor and the quickly terminated introduction of the HF which creates a highly reactive combination varying from point to point across the wafer surface. The resulting highly reactive but nonhomogeneous etchant gas is capable of high etch rates. Unfortunately, the results using this process have proven to be highly variable with nonuniform etching on the same device being a common problem as well as nonuniformity from one device to the next. Acceptance of this processing system was initially enthusiastic but has been nearly abandoned by chip manufacturers because of the seriousness of the nonuniformity problem in etching rates.

The nonuniformity problem also results from variations in the amount of water present in the matrix of the material being processed which can have very significant effects on the effective localized HF-water concentrations on the surface of the chip during the high speed etching reaction which occurs during this type of processing. Wafers otherwise processed in a similar manner may exhibit highly differing etch rates merely because they have been allowed to sit for hours under ambient conditions thereby uptaking atmospheric moisture to a substantially greater degree than other wafers processed soon out of a furnace or other moisture eliminating processing. Such variations in moisture content of the wafers are typical and any special pre-atmospheric treatment necessarily increases processing time, processing logistics, or both.

Another more recent approach to vapor etching of wafers using HF is incorporated into the processing machine referred to as the EDGE 2000 from Advantage Production Technology. This system utilizes a specially configured processing chamber which vacuum treats the wafer prior to processing with the etchant. This approach attempts to remove residual moisture from the wafer to address the nonuniform etching rate problem discussed above. The relatively short duration vacuum processing cannot remove all moisture content variations. The wafer is exposed to a highly reactive HF-water gas stream which is directed at the wafer in a vertical orientation from one or both sides. The jet of incoming reactant gas impinges upon the surface or surfaces of the wafer at localized central areas and typically results in nonuniformities in mass transfer due to this localized impingement despite the vacuum processing directed toward water removal.

The inventor hereof has discovered that vapor processing of semiconductor wafers, substrates and similar units using the novel processing described herein can result in the formation of undesirable particulate in some types of processing. The particulate has been manifested in localized deposits, or alternatively, in relatively diffuse layers generally deposited over the entire treated surface of the wafer. In some cases the particulate will be sufficiently concentrated to form a visible haze. In other cases the particulate will only be observable using magnifying instrumentation.

The exact nature of the particulate or particulates which form on the surface of the wafer is not known with certainty. However, it is believed to be one or more fluorosilicates formed by competing side reactions to the removal of silicon oxides by hydrofluoric acid. One possible fluorosilicate which may be formed is $H_2SiF_6$, hydrogen hexafluorosilicate. Others compounds or solid phase mixtures may also be present or the primary particulate being formed.

Thus there remains a strong need in the art for gaseous HF and other chemical processing which will provide uniform and repeatable results with highly effective etching rates while achieving low contamination and particle counts. Other objectives and advantages of the invention are also indicated herein.

BRIEF DESCRIPTION OF THE DRAWINGS

Preferred embodiments of the invention are illustrated in the accompanying drawings, which are briefly described below.

FIG. 3 is a front elevational view of a processing unit useful for carrying out processes of this invention.

FIG. 4 is a top view of the processing unit shown in FIG. 3 with a robotic transfer unit in a first position for loading and unloading disks from an inventory.

FIG. 7 is a cross-sectional view of a wafer holding processing head and associated base forming the chemical processing subunit of the processing unit shown in FIG. 3.

FIG. 8 is a top view of the wafer holding processing head of FIG. 7 shown in isolation.

FIG. 9 is a side elevational view of the wafer holding processing head of FIG. 8.

FIG. 10 is a bottom view of the wafer holding processing head of FIG. 8.

FIG. 20 is an enlarged elevational view showing the entry side of a heat processing subunit forming a part of the processing unit of FIG. 3. A portion of FIG. 20 has been shown broken away to reveal internal components.

FIG. 21 is a top view of the heat processing unit shown in FIG. 20.

FIG. 22 is a top view in isolation of a radiant heat shield which forms a part of the heat processing unit of FIG. 20.

FIG. 23 is a top view in isolation of a support ring which forms a part of the heat processing unit of FIG. 20.

FIG. 24 is an electrical schematic diagram showing portions of a preferred control system used in the processing machine of FIG. 3.

FIG. 25 is an electrical schematic diagram showing additional portions of a preferred control system used in the processing machine of FIG. 3.

FIG. 26 is a schematic diagram showing fluid handling aspects of the processing unit of FIG. 3.

DETAILED DESCRIPTION OF THE PREFERRED EMBODIMENTS

Figure 1:
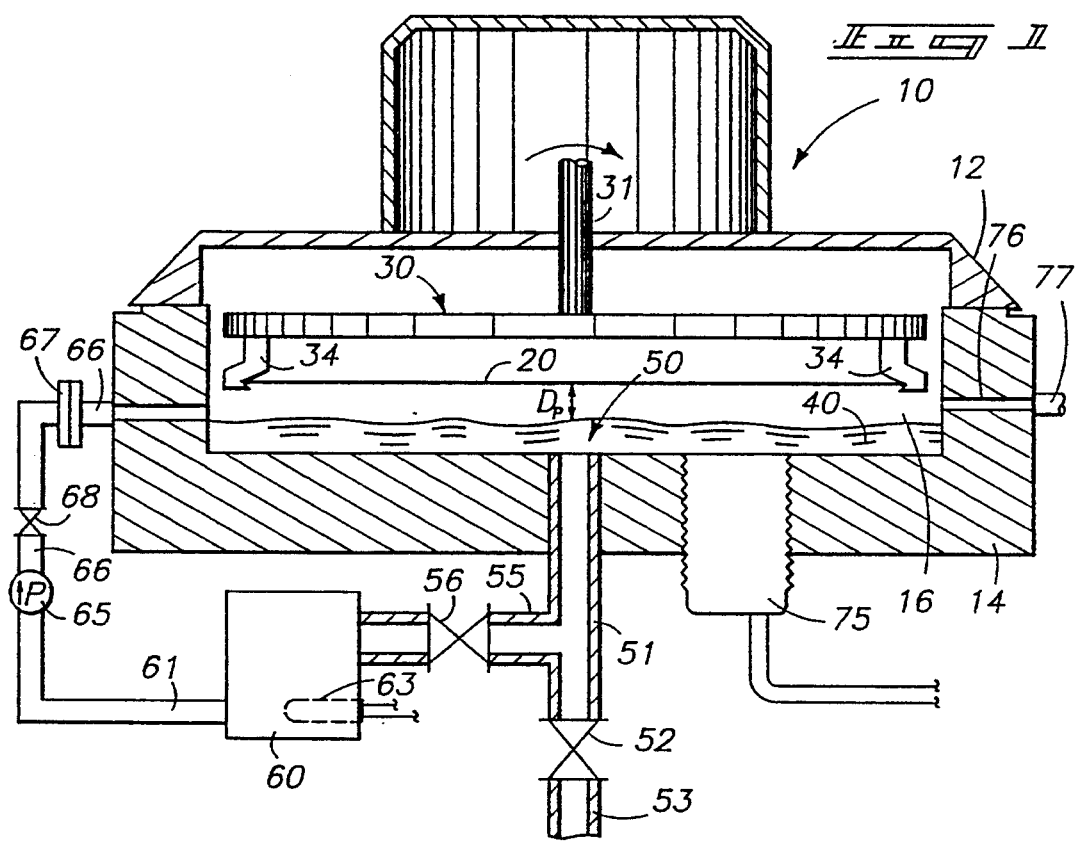
FIG. 1 is a side sectional view showing a preferred configuration for vapor processing wafers according to this invention.

This disclosure of the invention is submitted in furtherance of the constitutional purposes of the Patent Laws "to promote the progress of science and useful arts" (Article 1, Section 8).

Vapor Phase Processing

The novel processes according to this invention involve the production of a vapor mixture or solution which is used as an etching or reactant gas. The etchant used in the process includes an active ingredient or ingredients which are preferably one or more acids, preferably a hydrogen-halide acid, most preferably hydrogen fluoride. The most preferred etching vapor mixture includes hydrofluoric acid vapor and water vapor. The water vapor acts as a diluent and is important in inducing the reactivity of the hydrofluoric acid.

The manner of producing and presenting the vapor mixture to the semiconductor wafer or similar article being etched is of great significance in the achievement of a commercially viable process of suitable benefits to warrant use in the semiconductor chip manufacturing industry. The vapor mixture is preferably produced in a manner which generates a nearly homogeneous vapor mixture of the active etchant and diluent which acts as an etchant or other reactant gas. The vapor mixture is most preferably in equilibrium with a liquid phase source which supplies the reactant vapors. The liquid phase source is also preferably homogeneously mixed or in solution.

The typical utilization of the novel processes is in the removal of oxide and nitride layers, such as silicon dioxide layers from silicon wafers. The processes are also potentially applicable to the processing of other wafer and substrate materials, such as gallium arsenide and indium containing semiconductors. Still other types of semiconductor disks, displays, magnetic disks or other articles of this type needing etching or other chemical processing may also potentially be suitable for treatment using the novel processes described herein.

The etchant gas is preferably produced from a homogeneous liquid mixture or solution of hydrofluoric acid and water which forms a liquid source from which a homogeneous equilibrium vapor etchant is preferably produced. Other etchant and diluent sources or other multi-chemical systems having at least a first chemical and a second chemical may alternatively be possible.

The preferred liquid phase source is advantageously comprised of hydrofluoric acid and water in sufficient amounts to provide relative molar concentrations in the approximate range of 1:100 to 1:1 (hydrofluoric acid:water). More preferably, the liquid source of the etchant vapor includes amounts sufficient to provide relative molar concentrations in the approximate range of 1:50 to 1:5 (hydrofluoric acid:water).

The hydrofluoric acid and water used in preparing the liquid processing fluid or etchant source are preferably of very high purity without contaminating particles of organic or inorganic materials. Purity levels of the highest or nearly highest degree obtainable with chemical purification techniques now available are most appropriate.

The processing liquid mixture is advantageously maintained at a temperature suitable for producing vapor pressures of the constituents which cause good evolution of vapor to speed processing. Liquid processing fluid temperatures in the approximate range of 10°-100° C. are appropriate for aqueous hydrofluoric etchants. Temperatures in the range of 20°-40° C. are more preferred, with ambient temperatures of 20°-25° C. most typical.

The vapor processing is preferably done within an enclosed or confined processing chamber at pressures which are sufficiently high to prevent boiling of the liquid processing fluid. Processing pressures in the approximate range of 100-2000 torr are operable dependent upon temperature of the liquid mixture. Pressures in the range of 500-1500 torr are more preferable with atmospheric pressures in the range of 600-900 torr most preferable.

The liquid phase processing mixture can advantageously be assisted into vapor formation by a suitable vaporization enhancer. The vaporizing of the liquid phase can be enhanced by a suitable agitating, such as by circulating and mixing through a recycle system, such as described below, or otherwise agitating and mixing the processing liquid. It is alternatively, or additionally possible to use ultrasonic agitation to enhance vapor formation. Enhanced vapor formation can serve to increase processing throughput and availability of the vapor phase mixture to the wafer or other unit being processed.

The homogeneous etchant or other reactant gases used in the novel processes of this invention are preferably presented to a wafer being processed so as to uniformly contact the surface or surfaces being etched or otherwise chemically processed. The use of carrier gas is specifically not employed because of the inventor's identification of substantial complicating and derogatory effects of such an approach. Carrier gases tend not only to dilute the vapor and reduce etch rates, but also to represent substantial additional problems in maintaining homogeneity and effective etching upon the surface of the wafer being processed.

The preferred etchant gases are contacted against the processed surface of the wafer in a manner specifically designed to minimize the potential for nonhomogeneity and variations in the microscopic localized concentrations of the etchant and diluent or other constituent chemicals, such as the typical hydrofluoric acid and water. The etching rates of aqueous hydrofluoric acid mixtures vary dramatically as a function of differing relative concentrations of these constituents. Such variations have plagued the semiconductor industry resulting in uneven etch rates which are increasingly troublesome in chips having smaller and smaller feature sizes.

A preferred manner of presenting the reactant vapors is to generate the vapors from a pool of homogeneous liquid mixture. The homogeneous liquid mixture is most preferably in close physical proximity to the wafer surface being processed. This is advantageously accomplished by forming a pool of the liquid source which is maintained in a homogeneous condition by suitable mixing. The wafer is then processed by closely positioning the wafer to the source pool or otherwise effectively transferring the reactant gas mixture from the liquid source to the unit being processed. The manner of transfer must provide a homogeneous etchant or reactant gas at the wafer surface being processed.

The preferred manner of presentation of the etchant vapors to the processed wafer surface or surfaces is also to orient the processed surface to face downwardly. This presents the treated surface in a manner which resists particle migration to the surface by the force of gravity. Downward orientation can also be advantageous employed to bring the processed surface of the wafer into closer proximity and juxtaposition to a liquid source of the vapor and improves the mass transfer between the source and surface to maintain high etch rates. The wafer surface being processed is preferably in the approximate range of 2–100 millimeters from the surface of the liquid etchant source to facilitate circulation and mass transfer.

The novel processes of this invention also include rotating or otherwise appropriately moving the wafer during the presentation of the etching vapors to provide uniform dispersion of the reactant gas over the entire processed surface of the wafer. The rotation or other relative motion of the wafer being processed is also significant in creating circulation which provides adequate mass transfer between the source, vapor and surface being treated. At sufficient rotational speeds a vortex action develops which can be significant in providing the desired mass transfer and circulation. These dynamic flows in the circulating etchant vapors also are significant in maintaining homogeneity and equilibrium in the vapor phase so that etch rates are uniform across the wafer and repeatable from wafer to wafer.

The dynamic action of the wafer is preferably at rotational speeds of at least 20 revolutions per minute (rpm). Speeds less than 20 rpm have been found inadequate to fulfill the processing needs of the system. More advantageously, the relative wafer rotational speeds are in the approximate range of 20–1000 rpm because excessive speeds are believed to cause a substantial derogatory effect in particle counts on the wafer. Although the specific mechanism is not known with precision, it is believed that the high rotational speeds cause such extensive turbulence that particles are agitated to a point causing migration onto the wafer surface from either the liquid source or the processing equipment. High rotational speeds may also cause electrical charge (static electricity) to develop which may aggravate the potential, otherwise raised by the turbulence, for particle migration to the surface of the wafer being treated.

Although rotational speeds in the range of 20–1000 rpm are operable, experimentation has indicated that rotational speeds in the range of approximately 30–800 rpm are improved in maintaining low particle counts as compared to rotational speeds outside this range. Still further significant improvement has been shown when the rotational speeds are in the range of approximately 50–400 rpm. Still further preferred are rotational speeds in the approximate range of 50–250 rpm. The indicated speeds apply to wafers of approximately 8 inches (~200 millimeters) diameter or less. Wafers of even large sizes may be appropriately processed at such speeds with additional precaution due to the increased centrifugal forces developed.

The novel processes of this invention further advantageously include drying the wafer after the vapor phase chemical processing, such as the etching described above. The vapor processing can lead to condensation of the vapors onto the surface of the wafers. The drying advantageously includes a post-acid-processing spin cycle immediately after the vapor phase processing described above. The wafer is rotated as during the vapor phase processing or with increased rotational speeds, such as greater than 1000 rpm. Spinning speeds in the approximate range 1000–3000 rpm are suitable, with speeds of 1000–2000 most preferred.

The spin dry processing can be assisted by also passing a flow of suitable drying gas through the processing chamber to further supplement or finalize the drying process. The drying gas is preferably a non-reactive gas, such as nitrogen or an inert gas. The drying gas can be heated or supplied at ambient temperatures. Drying gas having temperatures in the range of 0°–200° C. are appropriate, with temperatures in the range 20°–100° C. more preferred. The drying gas can be supplied so as to impinge upon the processed surface or surfaces being dried.

Processing Apparatuses

FIG. 1 shows relevant portions of a preferred semiconductor processing machine adapted for carrying out the novel processes of this invention. Processing machine 10 includes a movable head 12 which mates with a processing bowl 14 to confine a processing chamber 16. Processing head 12 includes a suitable wafer holder 30 for holding a disk-shaped wafer 20 using fingers 34 in a desired orientation with the processed surface facing downwardly. The wafer holder 30 is provided with a motor or other drive (not shown) which is connected to the drive shaft 31 to rotate the wafer in the desired rotational processing described above.

The arrangement shown in FIG. 1 includes the wafer 20 in superposition above a subjacent pool 40 of the liquid source used for producing the gaseous etchant. The proximity distance $D_p$ defines the amount of separation between the upper level of the liquid etchant source and the nearest wafer surface being processed. The preferred range of $D_p$ is the indicated 2–100 millimeters. The processed surface of wafer 20 is in directly opposite juxtaposition to the subjacent pool 40.

The processing machine 10 is also advantageously provided with a means for maintaining a homogeneous mixture of the liquid phase constituents. This is suitably provided in the form of a central drain 50 which has a system outflow line 51 through which liquid is drained through drain valve 52 to a disposal line 53. The outflow line 51 is advantageously branched to form a recycle line 55 which empties into a reservoir 60. Reservoir 60 can advantageously be provided with a suitable temperature affecting or control unit, such as a thermostatically controlled electric resistance heating coil 63 for maintaining or providing the processing liquid at a desired temperature. Coil 63 can alternatively be a fluid heat exchanger used to cool or heat the contents of reservoir 60. When HF and water etchants are used temperatures in the approximate range 10°–100° C. are most appropriate. Alternative processing temperatures may be used or needed if different etchant or other processing fluids are used.

Reservoir 60 is provided with an outflow in the form of pump feed line 61 which communicates fluid to the inflow side of a suitable mixing pump 65. Pump 65 and outlet valve 68 are controlled to deliver a supply of the processing liquid to form pool 40 in the lower portions of processing chamber 16. Filter 67 is provided in the pump outflow line 66 to remove particles from the recirculating liquid source. A reservoir recycle control valve 56 is provided to assist in the control of the level of pool 40.

The processor 10 also advantageously is provided with an ultrasonic agitator 75 of suitable design which are commercially available. Agitator 75 can be activated during the acid processing to agitate and enhance vapor formation.

FIG. 1 also shows that the processing chamber 16 is further fitted with a drying gas introduction port 76 which receives nitrogen or other drying gas from drying gas supply line 77. The drying gas can be input into the processing chamber via a plurality of circumferentially spaced ports which are at approximately the same elevation as the wafer or slightly below and oriented to direct the flow of drying gas across the processed wafer surface.

Operation of Apparatus

Processor 10 is operated to carry out the processes described herein. Prior to etching, the wafer 20 is otherwise suitably processed in a variety of related processing steps dependent on the particular integrated circuit product being produced. The head 12 is loaded with wafer 20 which is held in position by the wafer holder. The head is then positioned in sealing relationship with the bowl 14 or otherwise suitably adjusted to confine the processing chamber against drafts and other substantial leakages which might affect the homogeneous vapor phase which is being presented for contacting and etching the processed surface of wafer 20.

The bowl is thereafter filled with the source liquid for producing the etchant vapor using pump 65, supply line 66 and suitable control of valves 52, 56 and 68. The wafer is preferably rotated at a suitable speed, as indicated, during the filling operation and maintained briefly to better establish an equilibrium condition between the liquid etchant source and the vapor phase etchant gas within the processing chamber adjacent the wafer surface. This equilibrium can typically be established within 10 seconds to 1 minute depending on the size and proximity spacing of the system. The agitator 75 or recycle loop through reservoir 60 can be used to agitate the liquid phase source of the etchant to assist in the production of vapor therefrom. Rotation of the wafer at the desired speed is continued to perform the etching. Etching times are commonly in the approximate range 30 seconds to 3 minutes, with 1 minute etching times most typical. Pump 65 and valves 56 and 68 can be suitably controlled to recycle the source liquid to maintain homogeneity and to filter the liquid through recycle filter 67 which is preferably a 0.1 micron or smaller filter to remove particles from the liquid during recycle.

After the etching has been suitably completed then the valve 56 is opened and the pool of etchant source liquid is drained to reservoir 60 for reuse. Alternatively, it can be drained through valve 52 when it is expended. After the pool 40 has been drained the wafer rotational speed can advantageously be increased to speeds typically in the range of approximately 1000–2000 rpm to assist in the removal of any condensed vapor and to minimize the potential for residue. Such post-etching spin processing is typically done for periods of 30 seconds to 2 minutes, or as appropriate. The post-treatment spin can be performed while also passing a flow of drying gas through the chamber using inlet port 76. After the post-etching spin, the head is moved upwardly and the wafer removed in any suitable manner for subsequent processing.

Figure 2:
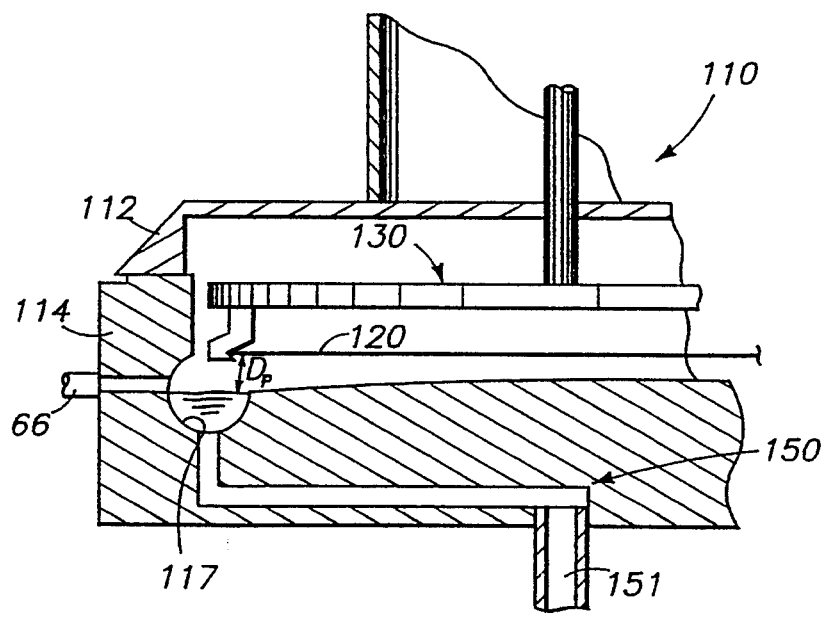
FIG. 2 is a further side sectional view showing another preferred configuration for vapor processing wafers according to this invention.

FIG. 2 shows portions of an alternative processing machine 110 similar to machine 10 described above. The notable difference is in the provision of a perimeter trench 117 in processing bowl 114 for confining the etchant or other processing fluid pool 140 therein about the periphery of the wafer 120. The wafer and supporting wafer holders preferably extend in close proximity to create vapor circulation between the toroid-shaped pool and the processed lower surface of wafer 120. Drain 150 and outflow line 151 are similarly connected to a recycle and drain system such as described above with reference to FIG. 1. The system shown in FIG. 2 is operated using processes the same or similar to that described above.

EXAMPLE

Liquid etchant was prepared by mixing hydrofluoric acid and water in amounts sufficient to provide a molar ratio of approximately 1:20 (hydrofluoric acid:water). The liquid was then charged into a processing apparatus similar to that described and shown in FIG. 1. The water and acid mixture was then circulated to help assure homogeneity and drained to the reservoir. The liquid mixture was used at room temperature. The wafer was installed in the head of the processor and the head and wafer were positioned for processing. The wafer was spun at approximately 150 rpm while etchant mixture was filled into the processing bowl beneath the spinning wafer. The wafer was spaced approximately 5.7 millimeters from the pool of etchant. After the mixture was sufficiently filled into the bowl, the wafer was processed for approximately 60 seconds. Thereafter the processing chamber was supplied with a flow of nitrogen at ambient conditions and approximately 2 psig pressure for approximately 1 minute to aid in evaporating any residual etchant vapors from the surface of the wafer. The resulting wafers were examined and found to have good etch uniformity and etch rates suitable for commercial processing.

Radiative Volutilization Processing

Novel processes according to this invention can further advantageously incorporate a heat volutilization step or steps to remove condensed fluorosilicates or other particles produced as by-products during the etching processes described above. The production of condensed fluorosilicates or other etching by-product particles may or may not be of significance in any particular process. However, where etching conditions or chemicals cause such particles to be formed on the processed side or sides of the wafer, then their removal is typically desired.

The volatilization of etching by-products is preferably accomplished by suitably heating the wafer or other unit being processed. This can advantageously be done by exposing the wafer to heat, such as in a heated chamber, or more preferably, by exposing the wafer to sufficient amounts of infrared radiation to cause heating of the wafer and volatilization of the etching by-products being removed. The radiative heating process preferably employed to cause volatilization can be performed to either processed or unprocessed surfaces of the wafer, or both. Most preferably the radiation is exposed to the back or unprocessed surface.

The radiant heating processes preferably used in volatilization of the etching by-products are performed for sufficient periods to cause volatilization of the particular by-products present. The heating steps will usually be performed for periods in the approximate range of 30 seconds to 5 minutes, more preferably 30 seconds to 2 minutes.

The radiation flux desired for volatilization is primarily a function of the desired speed of heating and the size of the unit being processed. Utilization of three (3) quartz-halogen lamps of 500 watts each has been found desirably fast for the processing of wafers of 6–8 inches (~150–200 millimeters) at a distance of approximately 0.5–4 inches (~13–100 millimeters).

The wafers being processed are typically heated to temperatures in the range of 100°–300° C. during the volatilization processing. When employing the aqueous hydrofluoric acid processing described above the volatilization processing is preferably in the range 100°–200° C., even more preferably 100°–150° C., most preferably about 130° C. The desired volatilization processing temperature may depend upon the particular by-product(s) being removed from the surface of the wafer and the size and material of the wafer.

Automated Wafer Processing Apparatus

FIGS. 3–6 show a preferred semiconductor processing apparatus 200 according to this invention which incorporates both chemical processing and radiative volatilization processing in an automated production machine. Processing unit 200 includes a framework 201 having a base portion 202 and a protective superstructure 203. Base portion 202 advantageously includes an access door for allowing inspection and maintenance of various system components including the control system described in FIGS. 24 and 25 and the fluids handling system described in connection with FIG. 26. The base also includes an upper deck surface 209 which supports various components as described below. The base is advantageously made of polypropylene or other suitable material.

Superstructure or cover 203 extends over most of base 202 of the processing unit. Cover 203 allows the area within to be purged with nitrogen or other suitable non-reactive gas to prevent or reduce oxidation or other reaction of the wafers during waiting and processing. The front or other appropriate side wall is advantageously adapted to function as an access door to the components mounted upon upper deck 209. Cover 203 can also be totally removed for complete access to the covered components mounted upon the upper deck surface 209. Cover 209 also provides a safety shield against processing accidents and restricts human access or exposure to operation of the robotic transfer system 210 described below. A suitable acid-resistant transparent material, such as plexiglass or polycarbonate, is advantageously used for cover 209 to allow observation during operation of unit 200.

Processing unit 200 further includes a wafer inventory structure 205 for inventory of wafers being processed; a chemical processing or etching subsystem 300 for performing chemical processes as taught herein; a radiative volatilization processing subsystem 400 for heat processing as described herein; and a robotic transfer unit 210 for moving wafers between the other subsystems.

The inventory subsystem of processing unit 200 includes one or more inventory structures such as wafer receiver 205. Wafer receiver 205 can be selected from a number of suitable commercially available wafer carrier designs. As shown, wafer receiver 205 includes a wafer support structure having a plurality of partially enclosed wafer inventory receptacles 207 which are oriented to receive and hold wafers 20 in flat horizontal positions stacked vertically with the circle-defining central axes of the wafers aligned along a common vertical line 206. Wafer receiver 205 is advantageously used to inventory wafers which are awaiting processing and to also inventory those which have already been processed by remaining subsystems of processing unit 200. As shown, cover 203 has been adapted by providing a cover inventory receptacle 208 in the front door which allows mounting of wafer receiver 205 therein.

Processing machine 200 preferably includes a wafer transport subsystem which is preferably a robotic transfer unit 210. The robotic transfer unit is used to handle wafers or other units being processed. As shown, robotic transfer unit 210 inserts and removes wafers from the inventory unit 205. The wafers are also transferred from inventory unit 205 to a chemical processing or etching subsystem 300. The transfer unit 210 also removes the wafers from the etching subsystem 300 and relocates them to a radiative treatment subsystem 400. After wafers are processed by the radiative treatment subsystem 400, the transfer unit is used to inventory the finished wafers in the inventory unit 205.

The robotic transfer unit 210 can be selected from a variety of suitable robotic systems capable of gentle but relatively quick movement between the various subsystems of processing unit 200, as described. A PUMA brand model 260CR has been found acceptable. The preferred robotic transfer unit 210 includes two arms 211 and 212 which are mounted on a swivel base. The unit also includes a movable distal end which swivels to achieved desired orientations. The arms adjustably support a wafer engagement head 213 which is suitably adapted to engage and hold the wafers 20 or other units being processed. Engagement head 213 is preferably a commercially available wafer vacuum head which extends along the back surface of the wafer and holds the wafer using applied suction.

Figure 5:
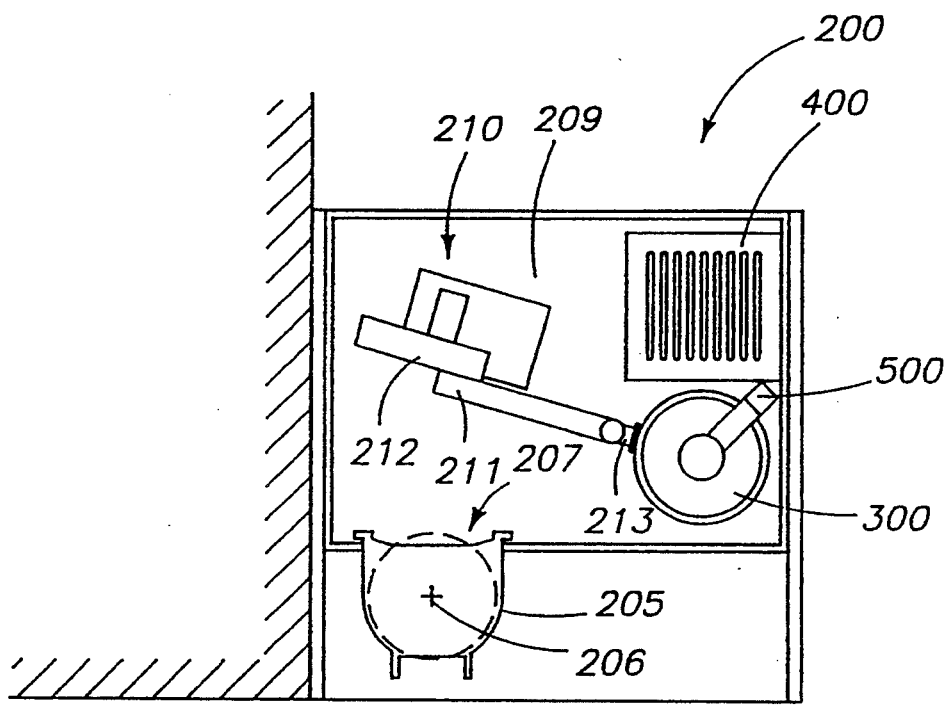
FIG. 5 is a top view of the processing unit shown in FIG. 3 with the robotic transfer unit in a second position wherein disks are loaded and unloaded from a chemical processing chamber.
Figure 6:
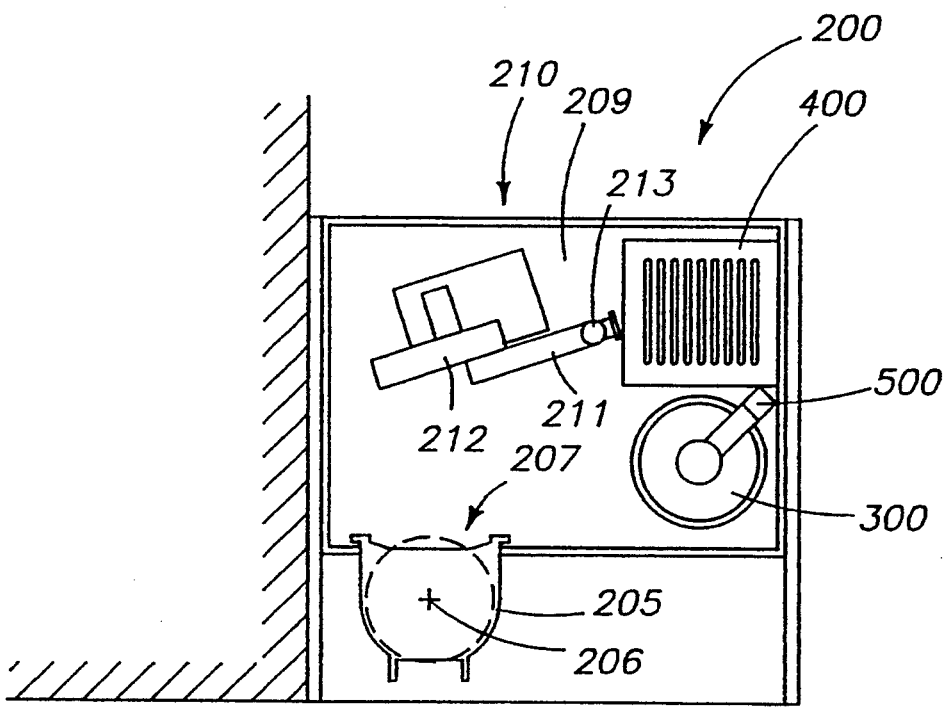
FIG. 6 is a top view of the processing unit shown in FIG. 3 with the robotic transfer unit in a third position wherein disks are loaded and unloaded from a radiative volatilization processing unit.

FIGS. 4, 5 and 6 show the robotic transfer unit 210 in three different operative positions. FIG. 4 shows transfer unit 210 in a first or inventory position wherein wafers are loaded and unloaded from the wafer receiver 205. FIG. 5 shows the transfer unit 210 in a second or chemical processor loading and unloading position wherein wafers are loaded or unloaded from the chemical processor subsystem 300. FIG. 6 shows the transfer unit 210 in a third or radiative processor loading and unloading position wherein wafers are loaded or unloaded from radiative processor subsystem 400.

FIGS. 7–18 show the chemical processing subsystem or etcher 300. FIG. 7 shows that etcher 300 includes a movable wafer support head 312 which mates with a processing bowl assembly 314. An upper processing chamber 316 is defined within upper portions of the bowl assembly and below processing head 312 when positioned together. The wafer support head 312 is movably mounted to the framework 201 using a movable head mounting structure 500 which will be described in greater detail below.

The wafer support head 312 generally comprises a main cover piece or shroud 313 which is generally disk-shaped and constitutes the main structural piece of the head. The outer edge of cover 313 is down-turned to form a rim 318. Rim 318 has an inwardly directed annular recess 319 through which nitrogen or other purge gas can advantageously be supplied. A ring-shaped band piece 367 extends along and covers the inside of recess 319 to define a conduit therewith. A series of small purge nozzles pass the purge gas from recess 319 inwardly toward flange 362 described below. Cover 313 is also provided with a central opening through which motor support 358 is received. The cover is advantageously made of polyvinylidene fluoride or other suitable acid-resistant material.

The processor head assembly 312 also includes a cap 360 which covers a drive assembly which will be described more fully below. The upper end of cap 360 is threadably mounted by a cap mount 327 which is supported by spacers 326 upon the motor support 358. Spacers 326 have interior bores which receive fasteners (not shown) which extend through apertures 328 formed through the cap mount 327. Within the top of cap 360 is a tool connection receptacle 361 formed by the cap mount 327 which is a convenience feature utilized for lifting and supporting the head assembly, such as in maintenance or in other processing equipment applications.

Processor head 312 also includes a wafer holder or support 330. Wafer support 330 is movably mounted to remaining parts of the head assembly to provide rotation or other appropriate relative motion between the wafer being processed and the processing vapors. The wafer support includes a disk-shaped wafer support plate 339 having an exposed downwardly directed front face and a upwardly directed back face removed from the wafer 20 being processed. The wafer support plate 339 is advantageously constructed of polyvinylidene fluoride with an upturned lip 362 about the periphery thereof. Lip or flange 362 can advantageously be provided with outwardly facing parallel grooves 363 to help restrict gas flow between lip 362 and the adjacent piece 367 forming the interior surface of the cover assembly.

Wafer support plate 339 mounts a plurality of wafer support fingers 334, such as the triad shown, or more. The wafer support fingers 334 have distal ends 337 which are formed to provide gripping notches 338 in which the peripheral edge of wafer 20 is held. The distal ends of support fingers 334 are spatially contracted toward one another to hold wafer 20, or expanded outwardly to release the wafer.

Figure 14:
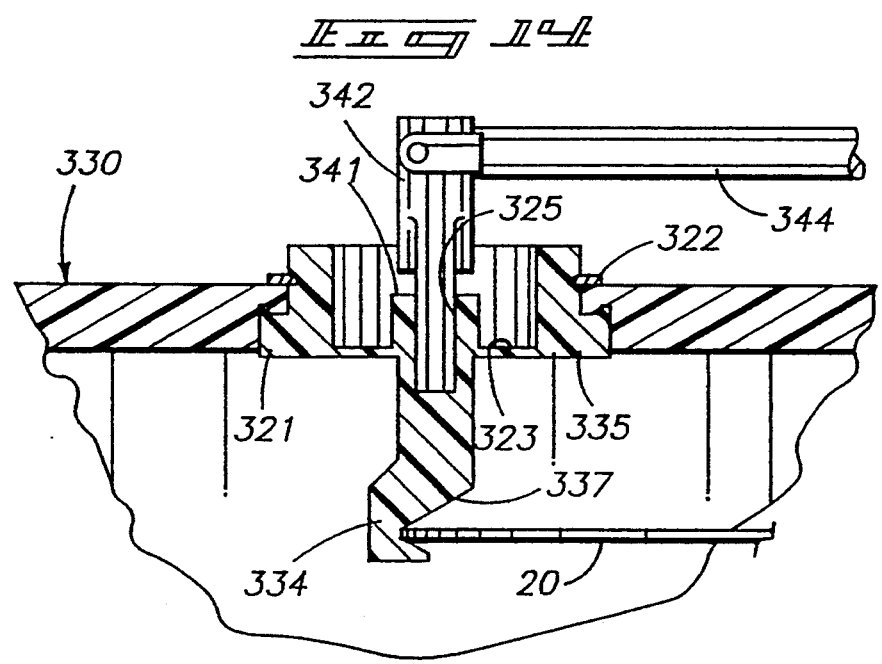
FIG. 14 is an enlarged sectional view showing a wafer support finger construction forming a part of the processing head of FIG. 7.

FIGS. 7 and 14 show that wafer support fingers 334 are flexibly mounted by finger bushings 335 to allow deflection thereof and the relative expansion and contraction needed for controlled gripping and release of wafer 20. Finger bushings 335 are preferably integrally formed with fingers 334 as shown best in FIG. 14. The finger bushings have an enlarged diameter exposed surface flange 321 which faces downwardly toward wafer 20. The finger bushings are held in position by a retaining ring 322 mounted to engage the back or upper surface of wafer support plate 339. The exposed, lower face also in part defines an annular web or diaphragm 323 which provides the flexibility needed to allow fingers 334 to pivotally deflect between expanded and contracted positions. The finger bushings 335 are made of a flexible material, such as TEFLON or other material suitable for service in the corrosive or other chemical environment which exists within processing chamber 316.

The wafer support fingers 334 also have upper or proximate ends 341 which are provided with connection receptacles 325. The connection receptacles receive end pieces 342 therein to form a mechanical coupling. End pieces 342 are displaced laterally by connection rods 344 to tilt the end pieces and attached wafer support fingers. The tilting action causes the relative expansion and contraction of the distal ends of the support fingers in the triad arrangement.

Actuation of the support fingers is advantageously accomplished using finger actuators 343 as shown in FIG. 7. The finger actuators 343 each include a connecting rod 344 which is pivotally connected at a first or outer end to an end piece 342. The inner or second ends of connecting rods 344 are pivotally connected to a remote end of a positioning link 345. The opposite or mounted ends of positioning links 345 are pivotally connected to the wafer support plate 339 using positioning link brackets 347. The positioning links 345 are oriented at oblique angles extending inwardly from the pivotal connections with the mounting brackets 347 toward the remote ends and the pivotal connections with connecting rods 344. The mounting brackets 347 can be provided with biasing springs (not shown) which urge links 345 upwardly and the associated wafer fingers 334 into contracted positions tending to grip the wafer.

The wafer support fingers are moved into expanded positions to release the wafer by displacing the pivotal joints between connecting rods 344 and positioning links 345 downwardly and inwardly. This causes the connecting rods to move inwardly in a radial direction to displace the proximate ends of the wafer fingers inwardly and the opposite distal ends outwardly to release the wafer. The connecting rods are displaced downwardly and inwardly by an annular contact ring 351. Contact ring 351 is operated by a pair of small pneumatic pistons 349. Pistons 349 are slidable within cylindrical piston cylinders 350 formed in motor support 358. Pressurized fluid is supplied to the upper sides of pistons 349, as shown in FIG. 7, to force them downwardly and cause contact between annular contact ring 351 and connecting rods 344. The pistons are returned by return springs 352 mounted within the piston cylinders.

The wafer support drive assembly includes a motor 359 which is mounted upon motor support 358. Motor 359 is preferably a brushless DC motor. Motor 359 has a hollow motor shaft 353 supported by a set of ball bearings 355. The hollow motor shaft 353 receives a detachable shaft 354 therethrough. The detachable shaft 354 is axially splined to the motor shaft using a spine pin 370 captured between a flanged shaft head 356 and the end of the motor shaft 353. The upper end of the detachable shaft is adapted for receiving a small screw 370 which pulls the two shafts into a tightened and anti-rotationally splined assembly. The flanged head is received within a shaft head receptacle 368 formed in the back surface of wafer support plate 339. Spaced, axially oriented, anti-rotation pins 357 are engaged between the lower face of the flanged shaft head 356 and corresponding holes formed in receptacle 368. A snap-ring retainer 369 holds the flanged head 356 axially within receptacle 368.

The angular positions of fingers 334 about the rotating assembly rotational axis X—X are preferably controlled to assume desired positions when the rotatable wafer support 330 stops. This indexing of the stationary positions of fingers 334 is needed when the processing head is opened to provide proper engagement of the wafer by the robotic transfer unit engagement head 213.

Figure 11:
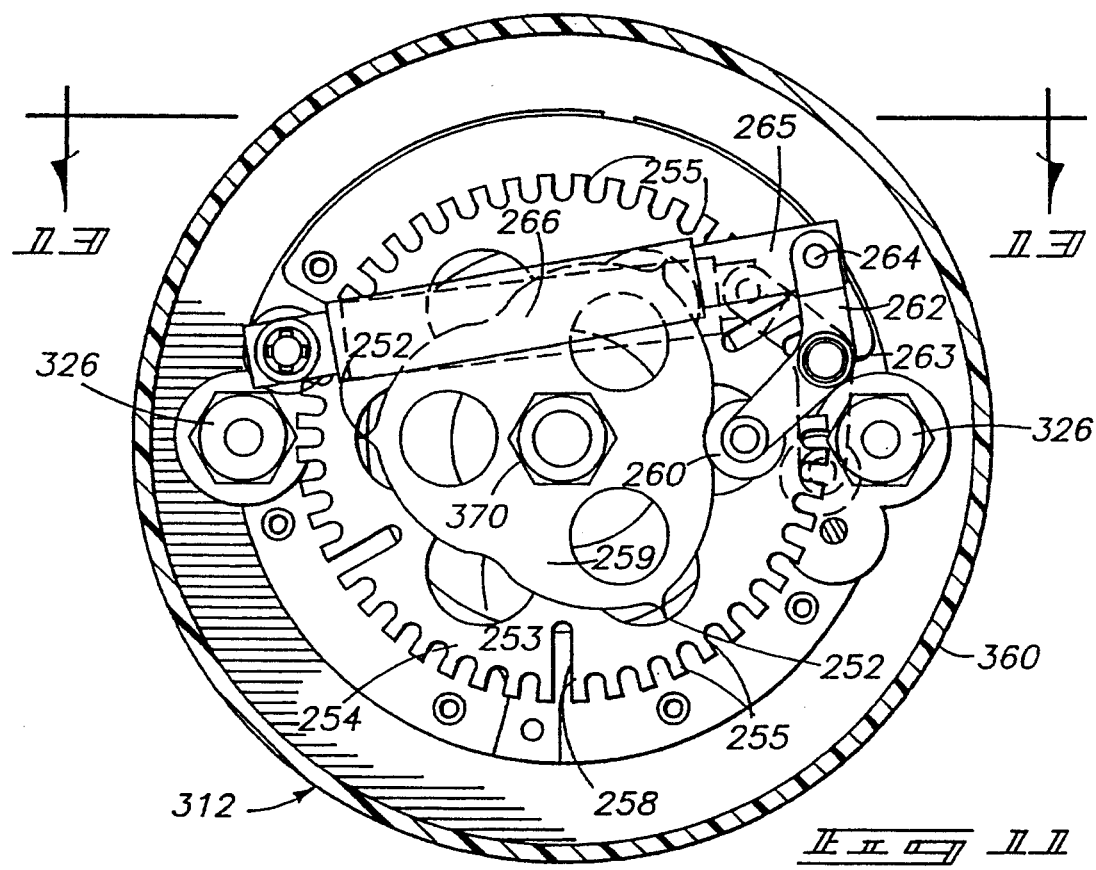
FIG. 11 is a sectional view taken along line 11—11 of FIG. 7.
Figure 12:
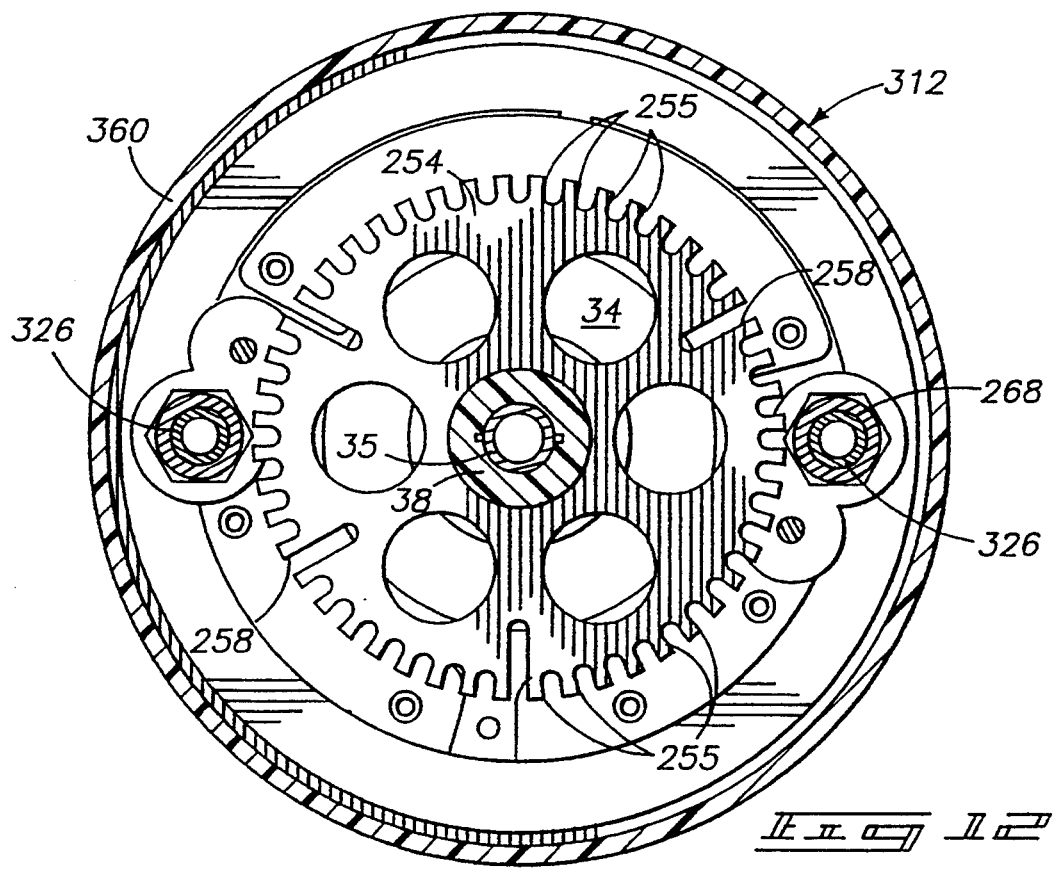
FIG. 12 is a sectional view taken along line 12—12 of FIG. 7.
Figure 13:
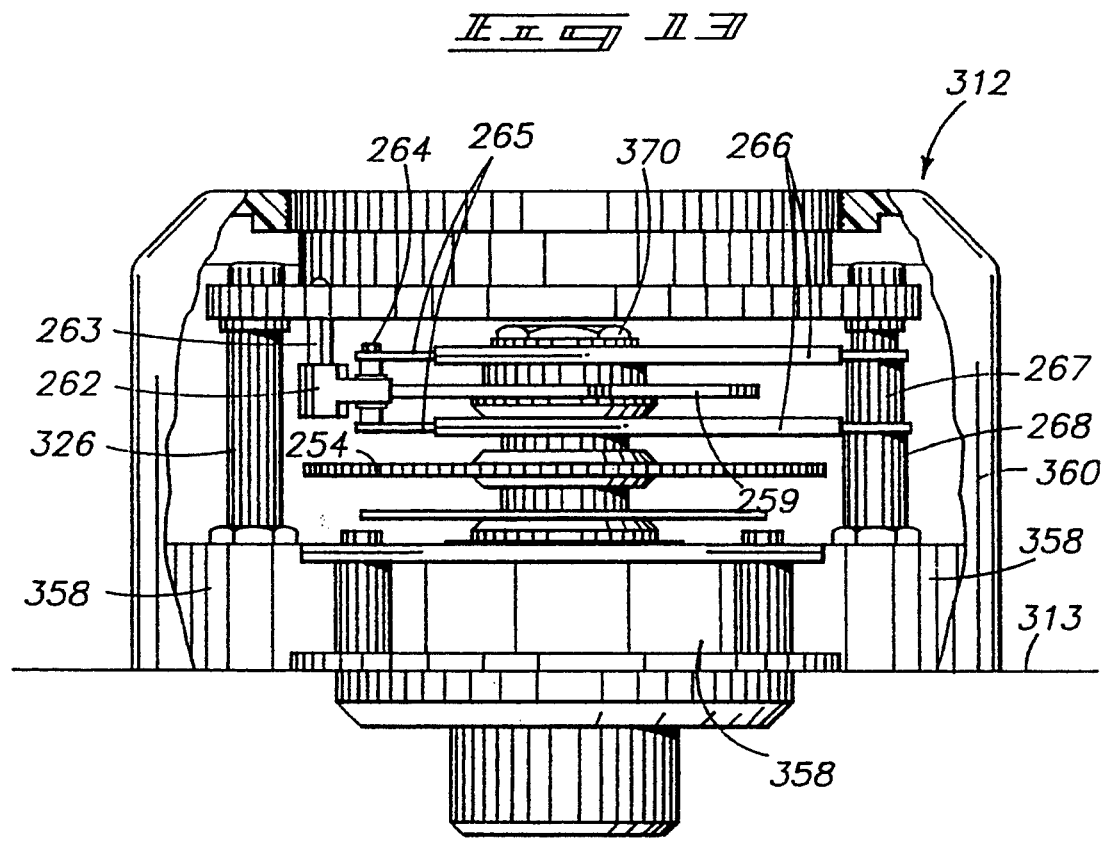
FIG. 13 is a sectional view taken along line 13—13 of FIG. 11.

FIGS. 7 and 11 show a preferred indexing means 250 used to position the wafer support, motor and other rotatable parts forming the rotating assembly of the processing head drive. Rotor positioning or indexing mechanism 250 includes a multi-sided cammed rotor plate 259 mounted to rotate with motor shaft 353 using shaft spacers 271, 272 and 273 held between the motor and end nut 370. The cam plate 259 has a plurality of sides equal in number to the number of fingers 334. Each side of rotor plate 259 has a curved edge configuration (shown in FIG. 11). The curved configurations of each of the three side segments are sloped relative to a circle defined by axis X—X. The curves slope from high points 252 at the adjoining ends of the side segments toward central low points 253. The central low points serve as a detent when engaged by an edge engagement roller 260 which is controllably forced inward. When motor 359 is inoperative and drive shaft 38 is freely rotatable, the inward force of roller 260 causes rotor plate 259 to pivot to bring the rotating assembly into an angular position which centers roller 260 within a low point 253 of the cammed rotor plate, as shown in FIG. 11.

Roller 260 is mounted at one end of a crank arm 262. Crank arm 262 is pivotally supported on a supporting shaft 263 depending from the cap mount 327 (see FIG. 13). The opposite end of crank arm 262 includes a pivotal connection 264 at which are joined the outer ends of two parallel pneumatic piston rods 265 that are part of two parallel pneumatic ram assemblies 266. The remaining ends of the rams 266 are pivotally mounted in parallel using spacers 267 and 268 which extend over spacer shaft 326.

The pneumatic rams 266 are normally spring biased into retracted positions wherein roller 260 is radially clear of the cammed rotor plate 259. When the rotor assembly stops rotation and indexing of the wafer plate 30 is desired, the small pneumatic rams 266 are extended to force roller 260 radially inward against the edge of rotor plate 259 to thereby position the rotor as shown in FIG. 11. The detent assures that the fingers 40 are angularly indexed when stationary to thereby meet operational requirements of the associated robotic wafer transfer unit 210.

A motion monitoring assembly is also advantageously provided within processing head 312 for measuring the speed and direction of rotation of the wafer plate 330 about the rotational axis X—X. The motion monitoring assembly includes a rotor indicating element, such as rotor indicator disk 254. Indicator disk 254 is provided with a series of peripheral notches 255 which intermittently pass and interrupt two radially spaced optical beams. FIG. 7 shows optical emitter 256 and optical detector 257 between which the optical beams pass. The large notches 258 are utilized to provide confirmation of the proper stationary positioning of the rotating assembly. The inclusion of one asymmetric large notch also allows direction of rotation to be determined. The small notches 255 interrupt the radially outward optical beam to provide an indication of angular speed.

FIG. 7 shows that the processing bowl assembly 314 is advantageously constructed using a first or outer processing bowl piece 371 which forms the basic structure of the bowl assembly. Outer processing bowl piece 371 is advantageously made of polyvinyl chloride plastic or other suitable materials. The outer processing bowl piece 371 is cylindrical in basic shape with a side wall 271 and bottom wall 272. An annularly shaped second or inner bowl piece 372 is mounted within the outer bowl piece and forms an annular liner along the side wall of processing bowl assembly 314. The inside bottom of the outer processing bowl is also preferably lined with a third bowl piece or bottom wall liner 390. The inner bowl piece and bottom wall liner are made from materials suitable for direct contact with the HF or other processing chemicals used in the processing chamber 316, preferably TEFLON or other suitable fluoropolymer.

The top edge and outer periphery of the processing bowl assembly can advantageously be provided with a fourth piece or bowl lip piece 366 which forms an outer ring covering the upper edge of the processing bowl. The bowl lip piece provides a seat upon which the processing head cover 313 rests when assembled with the processing bowl. The processing head ring 367 fits along the inner diameter of lip piece 366 and serves to more precisely locate the parts relative to one another.

The second bowl piece has a shoulder 373 which bears upon the upper surface of the outer bowl piece 371. The outside surface of second bowl piece 373 has an exhaust distribution chamber channel 376 formed therein extending around portions of the piece. A web 374 is formed by an annular extension of the second bowl piece to aid in diffusing an exhausting vacuum which is connected to enter at port 377 between the web 374 and the interior surface of main bowl piece 371. A convoluted exhaust chamber 375 is formed between the interior wall of the outer piece 371, about web 374 and within an axially extending groove 275. Groove 275 extends upwardly and applies a controlled exhausting vacuum pressure along the periphery of wafer support plate 339. A drain port is provided from the exhaust chamber 375 at fitting 378 to allow removal of any vapors which condense within chamber 375. Exhaust chamber drain fitting 378 also serves as an overflow drain for chemical chamber 389 via overflow passage 277.

The second processing bowl piece also has an inner portion 380 which has an upper lip 381 formed along a septum 382. Lip 381 extends inwardly to form a constricted passage with flange 362 of the rotatable wafer support plate 339. This serves to help distribute the controlled exhausting vacuum about the periphery of the upper processing chamber 316. Below septum 382 the interior surface of the inner portion 380 extends downwardly and inwardly to form a lower sealing lip 383 along an intersection with an intermediate interior shoulder 384. The sealing lip 383 is directed inwardly and downwardly to seal against a movable processing bowl plug 385 which forms the bottom of the upper processing chamber 316.

The second processing bowl piece 372 is also advantageously provided with a circumferential groove 278 which receives an annular mounting ring or ring pieces 279. Ring 279 receives fasteners (not shown) which extend upwardly through the bottom wall 272 and bottom liner 390 to securely hold the second bowl piece, bottom liner, and outer bowl piece together in an assembly. Groove 278 can also advantageously be adapted to receive an O-ring 280 for sealing between the outer bowl and second bowl piece.

The processing bowl plug 385 is disk-shaped and extends across the processing chamber immediately below the wafer 20 supported by wafer support plate 339. An upper surface 386 of the plug 385 is domed, such as from a central point outwardly, to facilitate drainage of fluids toward the periphery. The plug is advantageously mounted for upward and downward relative motion to controllably form a fluid-tight seal between peripheral regions of the upper surface 386 and the sealing lip 383 on the processing bowl liner 380. Plug 385 works relative to the sealing lip 383 of the second bowl piece 372 to form a vapor phase control valve which controls the communication of processing vapor between the subjacent chemical chamber 389 and wafer processing chamber 316 by controllably partitioning between these chamber.

Plug 385 is preferably mounted atop a flexible bellows 388 which is advantageously in an integral formation with the plug to minimize sealing problems. The plug and bellows is preferably made from TEFLON. The bellows allows controlled upward and downward motion while providing resistance to significant lateral motion. Plug 385 and connected bellows 388 are moved upwardly and downwardly by three angularly spaced valve plug actuators 394 which are preferably pneumatically operated. Each plug actuator has a throw rod 395 which is connected at its upper end to an enlarged boss which is welded to a retaining ring 283. Pressurized gas is controllably and alternatively supplied to each side of an internal piston 285 to drive the throw rod upwardly and downwardly. Mounting ring 283 mounts beneath the plug using a bayonet or other suitable mechanical connection. A snap ring or other retainer 284 can also be used to connect the mounting ring to the chemical chamber valve plug. A spring 286 biases the plug closed in case pneumatic pressure is lost.

As shown, plug 385 is also provided with a sensor fitting such as thermocouple compression fitting 397 for allowing monitoring of the temperature within the processing chamber adjacent to the wafer 20. A thermocouple or other temperature sensor 399 is mounted within passage 398 of the fitting.

The bottom of bellows 388 is connected to the bottom of the processing bowl assembly using fasteners (not shown) which extend through holes 393 formed in the bottom wall of the outer processing bowl 371. Such fasteners also extend through corresponding holes formed in the bottom liner 390 and bottom flange 391 of the bellows, and are secured to a stainless steel backup ring 392. The bottom flange of the bellows rests in an annular shoulder formed along the upper inside surface of the ring-shaped bottom liner 390.

An annular liquid phase chemical trench or chamber 389 is defined between the outside of the bellows, the inside of the second processing bowl piece 372 beneath shoulder 384 thereof, and above portions of the bottom liner 390. The upper surface of the bottom bowl liner 390 is sloped to provide drainage from the annular chemical trench toward an chemical trench drain 396. Drain 396 is connected to a reservoir and recycle system the same or similar to that connected to drain 50 of FIG. 1. Etchant or other liquid phase chemicals are supplied to chemical trench 389 via a chemical trench supply port 549 shown in FIG. 26) which is constructed the same or very similar to drain 396 and positioned approximately 180° of arc therefrom on the opposite side of the chemical trench. FIG. 7 has been modified to show the construction of fitting 378 instead. Liquid phase chemical flows in the inlet and divides into two opposing semicircular flows to drain through drain 396.

Figure 15:
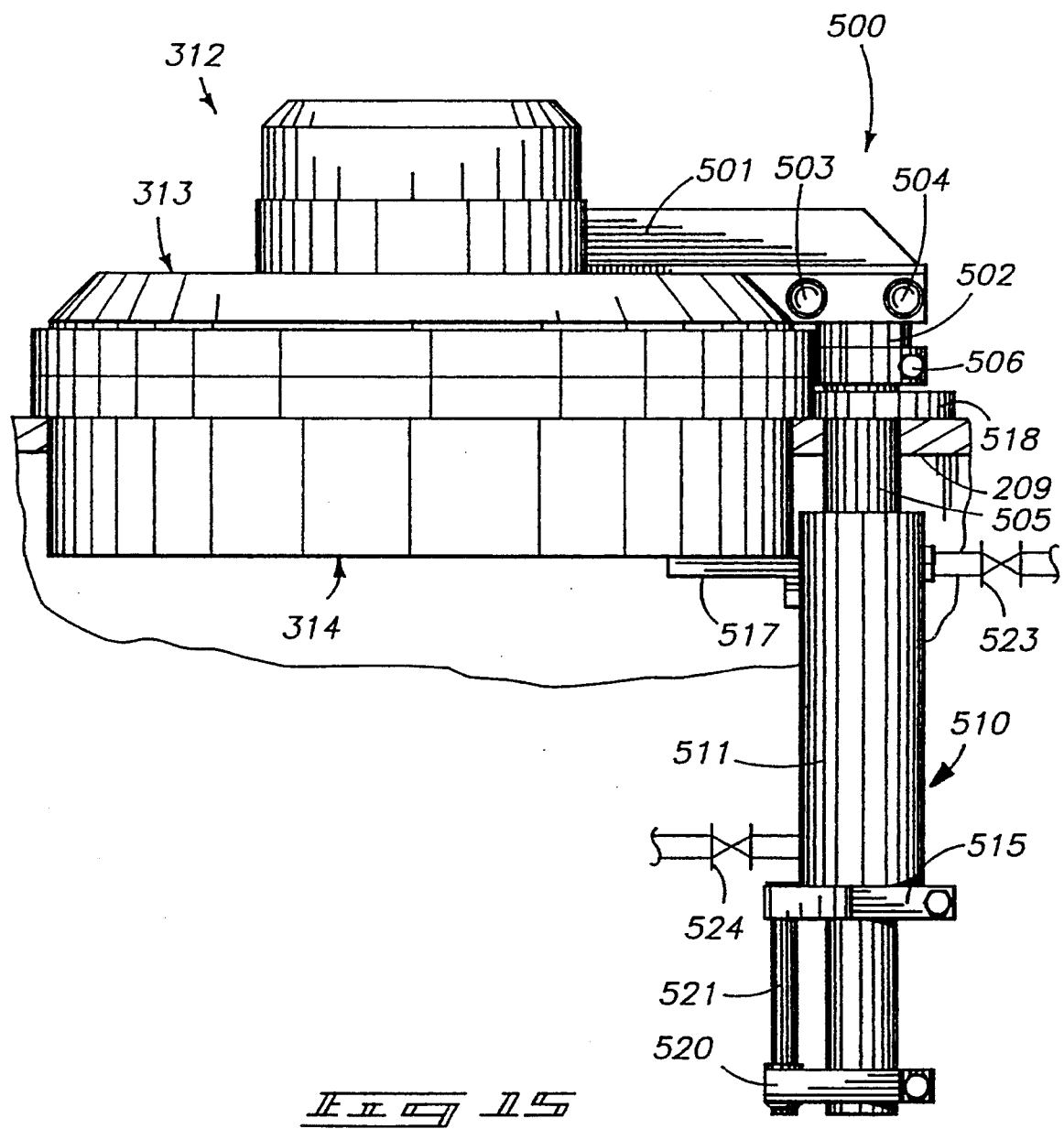
FIG. 15 is an elevational view showing the processing head and base of FIG. 7 with associated head movement mechanisms.

FIG. 15 shows processing head 312 is supported in a cantilevered arrangement using a processing head support 500. Processing head support 500 includes an upper arm 501 which is substantially horizontal and connected to the processing head cover 313. The outer end of arm 501 is pinned to a support bracket 502 using pins 503 and 504. Bracket 502 is mounted to a vertical support shaft 505 using a detachable bolt 506 or other suitable faster.

Vertical support shaft 505 is hollow and cylindrical although other forms are also possible. Shaft 505 is mounted for vertical movement to raise and lower the wafer support head assembly 312 up and down to allow access for loading and unloading wafers and to close the processing chamber for use. The vertical movement of shaft 505 can be accomplished using several different configurations. As shown, shaft 505 is mounted within and forms a part of a vertical operator 510 which allows controlled axial movement of the shaft.

Figure 16:
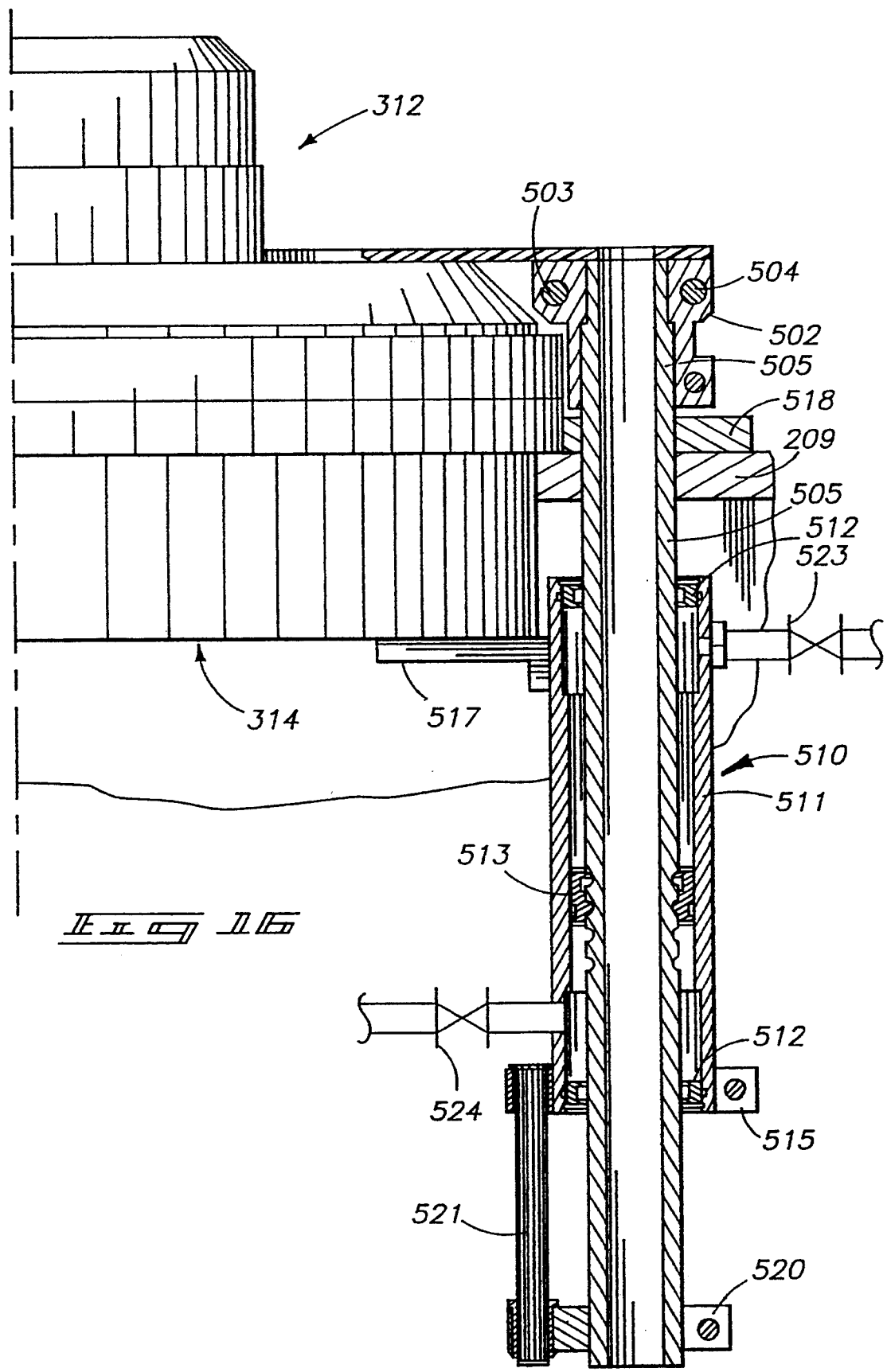
FIG. 16 is an enlarged partial sectional view of the mechanisms shown in FIG. 15 with the processing head in a lowered position.

Operator 510 includes an outer operator tube 511 which receives the shaft 505 therethrough. The upper end of operator tube 511 is mounted to the bowl assembly 314 using bracket 517 to aid proper alignment. The lower end of tube 511 is mounted using bracket 515 to the framework base 202. Operator 510 also includes end seals 512 which seal between shaft 505 and tube 511 to allow pressurization within the tube interior about the exterior of shaft 505. Shaft 505 is fitted with an annular piston element 513 which is received within grooves formed on the shaft at a central location, The piston element slides within the bore of operator tube 511 in response to controlled gas pressure applied via valves 523 or 524 and associated upper and lower pressurization ports in tube 511. This provides a double acting pneumatic ram with shaft 505 and attached piston element 513 acting as the moving element. FIG. 16 shows the processing head in a lowered processing position and FIG. 17 shows the processing head in a raised position used for loading and unloading wafers.

Figure 17:
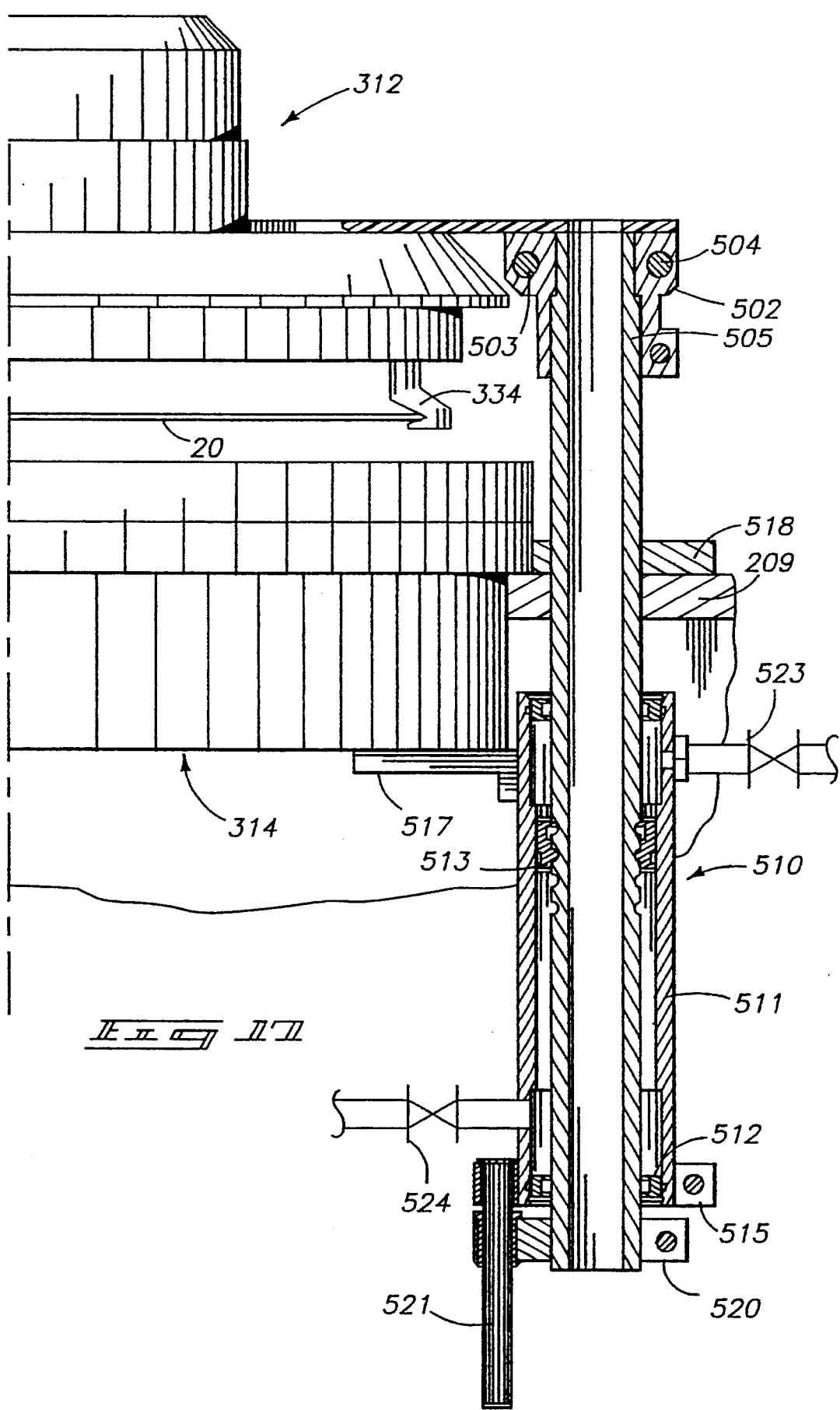
FIG. 17 is an enlarged partial sectional view of the mechanisms shown in FIG. 15 with the processing head in a raised position.

FIGS. 15–17 show that the lower end of shaft 505 is advantageously fitted with a bracket 520 which moves with the shaft. A stationary bracket 515 is mounted to the framework base 202 and supports the lower end of operator 510. Bracket 515 also supports a stationary guide rod 521. The moving bracket 520 on the end of shaft 505 slides along guide rod 521 as shaft 505 moves upwardly and downwardly in controlled response to fluid pressure supplied to operator 510. This guide rod arrangement serves as an anti-rotation device preventing rotation of shaft 505 within tube 511 to thereby maintain the processing head 312 in proper alignment with the processing bowl assembly 314. A guide bearing 518 on the framework base also surrounds and slidably receives shaft 505 to help stabilize the shaft.

Figure 18:
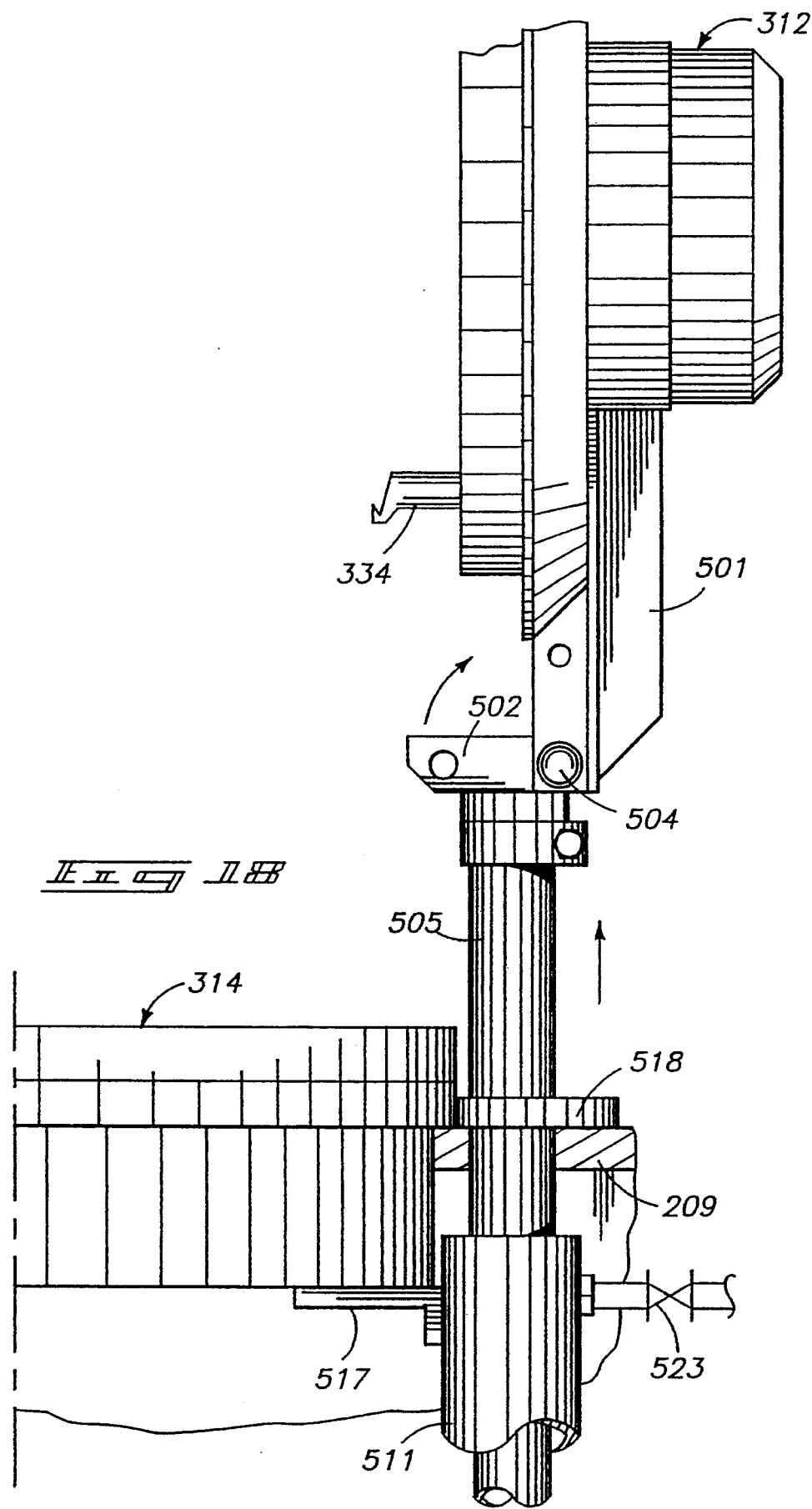
FIG. 18 is an elevational view of the mechanisms shown in FIG. 15 in a further raised position with the processing head tilted backwardly.

In addition to the vertical movement that can be imparted to processing head 312 by operation of the pneumatic cylinder assembly 510, processing head 312 can also be pivoted about a movable horizontal axis to tilted positions such as shown in FIG. 18. This is accomplished manually by first removing inner pin 503 which connects upper arm 501 to bracket 502. Removal of pin 503 flees the processing head 312 for movement about the horizontal pivot formed by the remaining pin 504. Processing head 312 can be pivoted into the position shown in FIG. 18 to permit substitution or repair of the wafer plate 330 and associated equipment described above.

Removal of the second pin 504 permits replacement of the entire processing head 312 on the upper end of shaft 505 when such substitution is desired. The electrical and fluid lines (not shown) between the processing head 312 and the interior of processing machine framework 202 are flexible and provided with conventional detachable connectors (not shown) to facilitate replacement and repair. Such lines are preferably extended through the hollow support shaft 505.

Figure 19:
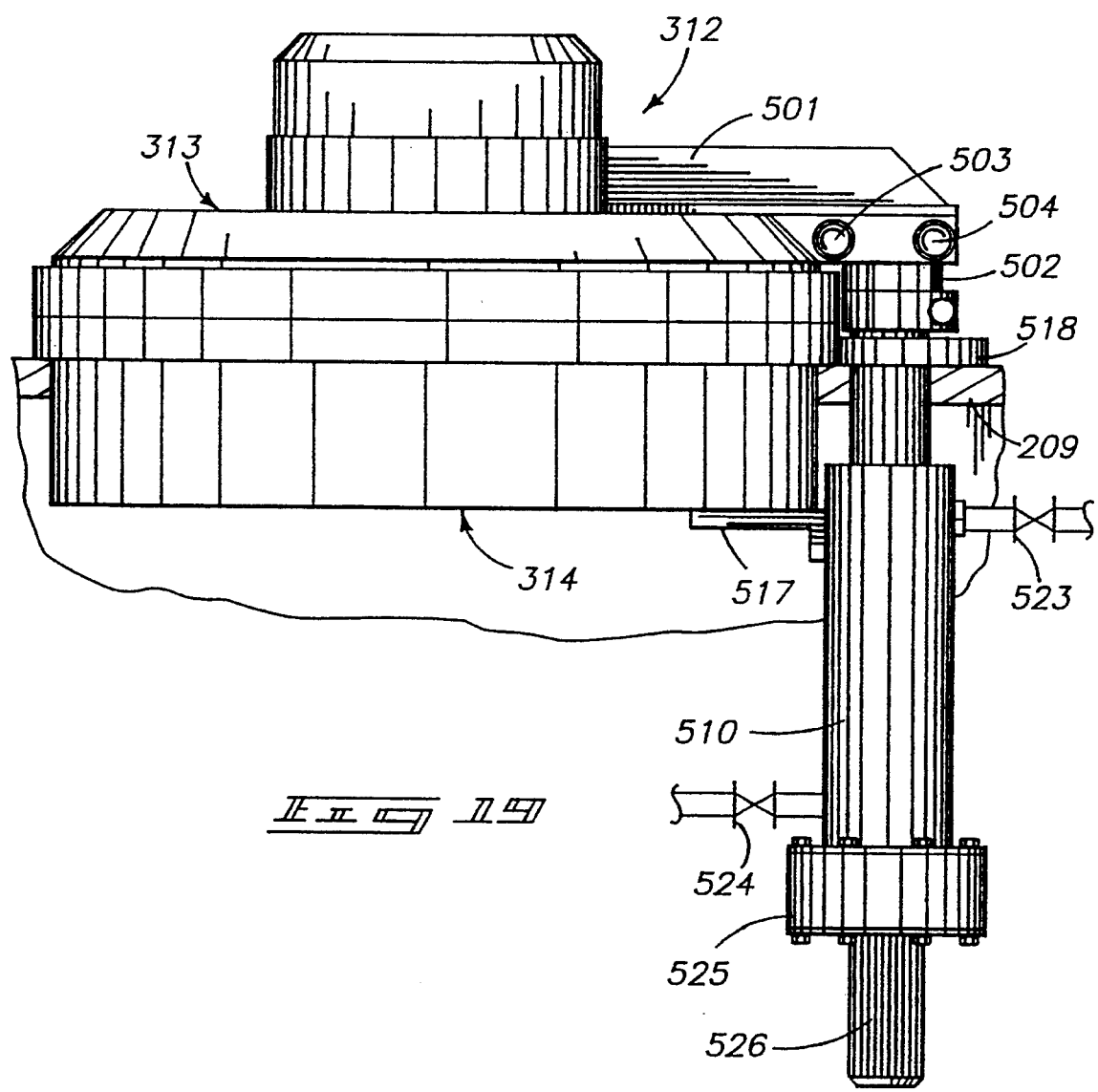
FIG. 19 is an elevational view similar to FIG. 15 with an alternative type of processing head mounting mechanism.

In some applications it may be desired to swivel the processing head about the vertical axis of shaft 505. Such pivotal movement can be accomplished using a structure such as illustrated in FIG. 19, wherein a rotary actuator 525 has been substituted for the vertical guide rod 521 and mounting 515. Rotary actuator 525 can be a pneumatic, hydraulic or electric motor designed to turn processing head 312 about the axis of shaft 505 to any desired angular position. The rotary actuator is mechanically connected to shaft 505 using interconnecting splines 526 formed on the shaft. The splines accommodate vertical movement of the shaft in response to actuation of operator 510.

Radiative Particle Volatilization Subsystem

FIGS. 20–23 show in greater detail the radiative particle volatilization subsystem 400 which can advantageously be employed to further process wafer 20. Volatilization subsystem 400 beams a diffuse blanket of relatively intense infrared radiation to uniformly heat wafer 20. The volatilization processing unit is advantageously used to eliminate fine particulate by-products which can result under certain processing conditions. The by-product particulates are of uncertain chemical composition but are suspected to be one or more compounds formed of hydrogen, silicon and fluorine which results from competing side reactions to the basic etching process of the silicon dioxide by hydrofluoric acid. One possible compound which may form a part or all of the indicated particulate is $H_2SiF_6$. Alternatively, the particles may be wholly or partly formed by other compounds. Nonetheless, it is desirable to further process wafers under some processing systems to eliminate such particle formation or assure that any particles have been removed before sending the processed wafers onto other processing.

The volatilization processing according to this invention is advantageously done by heating the wafer or other particulate bearing surface of the wafer to a suitable volatilization temperature. The inventor's research indicates that current forms of particulate haze need post-etching wafer temperatures greater than 100° C. for effective and efficient removal. The particulate removal heat volatilization processing is time and temperature dependent. At lower heat processing temperatures the processing time is increased. At higher heat processing temperatures the processing time is decreased. Wafer post-etching heat processing temperatures are preferably in the range of 100°–300° C., more preferably 100°–200° C., most preferably about 130° C. for the HF etching by-products. At a volatilization temperature of 100° C. approximately 2 minutes are needed to remove HF etching by-products. At 130° C. approximately 1 minute is needed.

The post-etching heat processing of this invention is advantageously done by heating in a non-contacting manner to minimize the risks of applying contaminants to the wafer or other semiconductor device being processed. A preferred method for performing the post-etching heating is by exposure of the wafer or other semiconductor device to heat generating radiation. This is advantageously done by exposing the device being processed to an adequate intensity of infrared or visible radiation. The radiation is preferably beamed onto the wafer in a relatively uniform manner to prevent localized temperature variations and maintain relatively uniform temperature rise across the wafer.

The radiative volatilization processing subsystem 400 includes a protective cover 401 which can be formed from polypropylene or other suitable materials in a variety of configurations. As shown, cover 401 is substantially a box with an open bottom and a side access opening 410 (see FIG. 20). Side access opening 410 allows wafer 20 to be positioned within the radiative volatilization processing unit 400 for appropriate treatment as explained elsewhere herein. FIG. 21 shows that top wall 402 advantageously includes a plurality of heat escape openings 403. Heat escape openings can be formed in a variety of configurations including the elongated slots shown. FIG. 21 also shows that top wall 402 is preferably provided with a suitable number of connection apertures 404. Apertures 404 receive bolts 417 or similar fasteners therethrough for holding the cover 401 in place.

Volatilization processing subsystem 400 also advantageously includes an internal heat dissipation and radiation shield 411. FIG. 22 shows shield 411 in isolation. Shield 411 also serves as a frame to adjustably mount a ring-shaped support platform 420 which is shown in isolation in FIG. 22. The heat dissipation shield and frame 411 is substantially formed as a box with an open bottom and an access opening 412 in the side wall to allow positioning of wafer 20 into the unit. The internal combined heat dissipation shield and frame is preferably made from a heat conductive metal, such as aluminum. A plurality of heat escape holes 413 are formed through the top wall of shield 411 to more uniformly release heat which builds up within the shield during operation. The heat dissipation shield and frame 411 is also advantageously provided with side flanges 415 at the bottom edges along two sides to facilitate mounting of the unit to the top deck 209 using suitable fasteners which extend through holes 418 in the flanges and into deck 209. The top of the heat dissipation shield is provided with weld nuts 416 which receive fasteners 417 to mount the cover thereto.

The support ring 420 is mounted within the heat dissipation shield and frame 411 using a plurality of pins 421 which extend through a series of vertically spaced platform mounting holes 423 formed in the side walls of shield 411. The pins 421 extend through the side walls of shield 411 and into mounting pin receptacles 422 (see FIG. 22) formed in the edges of the ring-shaped platform 420. This construction allows the height of the platform to be adjusted for varying needs and processing parameters. The platform is advantageously made of aluminum.

The volatilization subsystem 400 also advantageously includes a wafer protection vessel 430 which is supported upon the adjustable ring-shaped platform 420. Vessel 430 is relatively transparent to the wavelength of radiation used to treat wafer 20. In the preferred embodiment the vessel is made of quartz which is relatively transparent to infrared radiation. The vessel is open along the side wall to form a wafer vessel access opening 431. The access opening 431 is positioned and oriented to be coincident with access openings 410 and 412. Vessel 430 is otherwise closed. A set of wafer support stands 433 are advantageously included within the wafer chamber defined within vessel 430 to provide limited contact support to preferably the back or unprocessed side of wafer 20. As shown, the stands 433 are also made of quartz. They can be provided in various numbers and configurations to provide adequate support for wafer 20. Vessel 430 is also preferably provided with a fitting (not shown) which allows a nitrogen or other suitable gas to be supplied to the interior wafer chamber. Such gas purging is most advantageous for impeding migration of contaminants into the wafer chamber, but may also be desired for other purposes such as preventing oxidation or performing chemical treatment.

The ring-shaped platform 420 is also advantageously provided with apertures 425 which receive fasteners 427. Fasteners 427 secure vessel hold-down brackets 426 used along both sides of vessel 430. The upper surface of platform 420 is further provided with corner locating pins 428 which extend upwardly to receive the corners of vessel 430 therebetween and maintain the location of the vessel relative to platform 420.

Volatilization subsystem 400 further includes a source of suitable radiation used to treat wafer 20. FIG. 20 shows a series of 3 spaced infrared lamps serving as the treating radiation emitters. The lamps are preferably quartz halogen type having power in the range of approximately 100-1000 watts, more preferably 500 watts each. The exact power requirements will vary dependent upon the particulates being volatilized and the size and relative spacing distance of the wafer being treated. The lamps are held within a fixture 441 which serves as the radiation emitter support. The lamp support fixture is advantageously mounted on a framework subdeck 215 which is mounted to base 202. The lamp fixture preferably includes reflectors 442 for directing the infrared or other radiation toward the wafer held in vessel 430. The lamp fixture is also preferably purged with nitrogen or other suitable gas to help dissipate heat.

Electrical and Fluid Handling Subsystems

FIGS. 24 and 25 show block diagrams indicating the basic control system used to operate automated processor 200. The system is operated with a system controller which is preferably a PC-type computer 530 or other suitable controller. Various system inputs and outputs are communicated to and from the computer as indicated. In general the output signals are translated via electrical solenoids which control a pneumatic solenoid which operates a valve or other system component. Alternatively, the operation of electrical components is accomplished using an electrical solenoid controlled switch without the need for a pneumatically operated solenoid. The operation and control of the various components has been integrated into the description otherwise given herein and will not be repeated.

FIG. 26 shows a preferred form of fluids handling subsystem which is used in processor 200. The chemical processor subsystem 300 is shown in schematic form. Vacuum is distribution chamber drain 378 is connected via a gas trap 538 to a chemical drain 535 which is appropriate for handling the HF or other processing chemical used in the chemical processor subsystem 300. The chemical chamber 389 is drained through drain fitting 396 to a valve manifold assembly including valves 541-543. Valve 541 serves to controllably direct liquid from drain 396 to a tank or reservoir 545 for drain-down and recycle purposes. Valve 542 serves to controllably direct liquid from drain 396 to an industrial waste drain line 536, to allow disposal of non-corrosive rinse water or similar waste streams. Valve 543 directs the outflow from chemical chamber 389 to the chemical drain line 535 for disposing of spent processing chemical.

Processing chemical is supplied from reservoir 545 via a reservoir outflow pump 546 which passes the processing chemicals through filter 547. The lower, upstream side of filter 547 is advantageously provided with a drain line 548 having a manual stopcock or other suitable drain control valve 554 which outflows to the chemical drain line 535. The upper, downstream side of filter 547 is preferably provided with a vent line 558 which returns to the tank 545. Pump 546 is made with TEFLON or other parts suitable to the corrosive service. Pump 546 is preferably like the pump described in U.S. patent application Ser. No. 464,101 which is incorporated by reference hereinto. The filtered chemicals pass into a manifold including valves 550-552. Valve 551 controls the flow of processing chemical delivered by pump 546 to the chemical chamber 389 via an inlet 549 (not shown in FIG. 7). Valve 550 controls the flow of deionized water (DI) from facilities services for purposes of rinsing the chemical chamber and processing bowl for maintenance and the like. A washdown gun 556 is also plumbed to the DI water line to allow manual maintenance washing of various system components. Valve 552 controls application of vacuum pressure to the manifold and associated conduits to assist in removing fluids therefrom for maintenance. The vacuum is generated using an aspirator 553 which operates using tap water which is passed through the aspirator and into the chemical drain line 535. The operation of aspirator 553 is controlled by a tap water aspirator valve 554 which controls the flow of water through the aspirator. Aspirator 553 also is connected to suck liquids from the bottom of the cabinet base at a cabinet sump 220. A sump liquid sensor 583 indicates the presence of liquids in the sump and the controller activates the sump valve 584.

Reservoir 545 is supplied with chemical or chemicals, such as HF, through one or more chemical supply lines. As shown, HF is supplied from an HF chemical supply bottle 560. Bottle 560 is monitored by a low level sensor 620 which indicates the need for replacement of the bottle. Chemical is pumped from chemical bottle 560 using a metering pump 561 made with parts made of TEFLON or other suitable materials for the corrosive service. Pump 561 is preferably substantially like the pump described in U.S. patent application Ser. No. 464,101 which is incorporated by reference hereinto. The outflow from pump 561 is directed to a valve manifold including valves 562 and 563. Valve 562 controls chemical delivery to reservoir 545 via line 565. Valve 563 controls the flow of nitrogen to clear valve 562 and lines 564 and 565. A recycle line 564 returns any chemical not delivered through valves 562 and 563 back to chemical bottle 560.

Reservoir 545 is also supplied with deionized water via line 566 which is connected to the facility DI water supply. Valve 567 controls the flow of DI water to a manifold connected to the drain of reservoir 545. Valve 568 controls whether the reservoir 545 is allowed to drain into the chemical drain line 535. Reservoir 545 is preferably provided with three level sensors 571-573 which indicate whether fluid exists at the particular level at which the sensor is mounted. Sensor 571 indicates low level, sensor 572 indicates that water filling should be stopped, and sensor 573 indicates an over-full condition.

Reservoir 545 is also advantageously provided with a stirring or mixing pump 576 which mixes the contents of the reservoir at all times to maintain homogeneity. Pump 576 is advantageously a diaphragm pump having TEFLON construction.

Reservoir 545 is further provided with a first heat exchanger 578 which is a coiled tube connected to a supply of typically cooling tap water controlled by coolant loop control valve 579. The expended coolant passed through the heat exchanger is suitably handled, such as by disposal in industrial waste line 536. The reservoir is also provided with a second heat exchanger which is preferably in the form of an electric resistance heating coil 580 which controllably heats the reservoir and its processing chemical contents. A tank temperature sensor 581 is included to sense tank temperature and provide temperature information to computer 530 for purposes of controlling heating and cooling operations in the reservoir.

FIG. 26 also shows a first purge gas distribution subsystem 593 which is used to distribute nitrogen or other suitable purge gas having relatively non-reactive or inert properties. Facilities nitrogen or other supplied purge gas is monitored using pressure switch 594. Purge gas going to a first branch of this subsystem is regulated through a first purge gas regulator 595 and the pressure is advantageously measured using pressure gauge 596. The pressure regulated purge gas is then filtered in filter 597 and controlled by valve 598. The outflow from valve 598 is supplied to the lamp fixture 441 powering volatilization chamber lamps 440 to dissipate heat therefrom.

The first purge gas distribution subsystem 593 also includes a second branch which utilizes a second purge gas regulator 600 and associated pressure gauge 601. The outflow from regulator 600 is controlled by valve 602 and filtered through filter 603. The regulated filtered nitrogen is supplied nitrogen purges for the processor head chamber 319 and within cap 360 to reduce or prevent processing vapor migration into the upper portions of the processing head which contains various corrosion susceptible components.

FIG. 26 further shows a second or volatilization chamber gas purge subsystem 585 having a gas inflow line 586 connected to a supply of nitrogen or other gas desired for protecting or treating wafers within the wafer chamber of vessel 430. Line 586 includes a connected pressure switch 587 which detects the pressure in the line and communicates information indicating the line pressure to the controller 530. A pressure regulator 588, downstream pressure gauge 589, and filter 590 are connected between the incoming line 586 and a purge control valve 591 which controllably supplies the regulated and filtered purge gas to the interior of vessel 430.

Processor 200 is also preferably provided with a clean dry air subsystem 605 which is connected to a facilities supply of such gas, or other appropriate gas. The compressed air is divided into three branches each of which is provided with a pressure regulator 606–608 and associated gauge 609–611. The compressed air from regulator 606 is monitored by pressure sensor or switch 612 for low pressure conditions. The outflow from regulator 606 is supplied to a number of electrically controlled, pneumatically operated solenoids which control various control valves as described herein. The flow from regulator 606 is also used to power pumps 561 and 546.

The second branch of the compressed air subsystem utilizes air from regulator 607 which is controlled by valve 614 and passed with an air operated aspirator 615. Air passed through aspirator 615 is preferably connected to a facilities exhaust system to minimize risk of particle contamination within the cleanroom or other processing facility in which processor 200 is employed. Aspirator 615 generates a vacuum which is monitored by pressure switch 616 and pressure gauge 617. The vacuum from aspirator 615 is supplied to the wafer engagement head 213 to provide suction used to hold wafers thereon during transport by the robotic transfer subsystem 210.

The third branch of the compressed air subsystem 605 supplies regulated air to pump 576 which is advantageously pneumatically operated.

Operation of Automated Processor

The operation and associated processing provided by wafer processor 200 will now be described. Incoming wafers 20 are inventoried in the wafer receiver 205 by manual installation of the receiver into receptacle 208 in the cover. The robotic transfer unit removes a desired wafer from the inventory contained in receiver 205 and transfers the wafer into position within head 312 of the chemical processing unit 300. The chemical processor head 312 is raised to allow installation of the wafer adjacent to the wafer support plate 339 using wafer support fingers 334. The wafer support fingers 334 are spread apart to receive wafer 20. After the wafer is positioned within fingers 334, the fingers are contracted inwardly to hold the wafer. The wafer head is then lowered into the substantially sealed relationship illustrated in FIG. 7.

The vapor control valve plug 385 is initially sealed against lip 383. Hydrofluoric acid and water, or other desired processing fluids, are preferably continuously recirculated through the annular chemical chamber 389 using pump 546 and associated recycle subsystem to maintain homogeneity. The desire temperature of the liquid phase reactants is maintained by the controller as sensed by sensor 581 and affected by heat exchangers 578 or 580. Exhaust port valve 537 is normally opened to exhaust any fumes from the processing chamber except while processing vapors are supplied to processing chamber 316. Wafer 20 is rotated in preparation for processing.

Vapor phase chemical processing is initiated by activating plug actuator 394 which retracts plug 385 downwardly to allow vapor phase reactants to move into processing chamber 316 and react with the surface of wafer 20 to thereby etch or otherwise process the wafer. The processing time, temperature, pressure and other parameters are according to the description given hereinabove, or as otherwise desired.

After the wafer has been sufficiently processed with the gas phase reactants then plug actuator 394 is deactivated and the vapor control valve is returned to sealing relationship with sealing lip 383. Closure of the vapor control valve isolates the processing chamber from the annular chemical trench. The vacuum exhaust 377 is again activated to remove etchant fumes from the processing chamber 316 to effectively arrest etching of wafer 20. The wafer is then spun for the desired time needed to dry the unit.

After etching or other chemical processing as described above, the processor head 312 is opened using operator 510 and the wafer is removed by transfer unit 210. This is accomplished by lifting the head 312 and then moving the robotic transfer unit to engage the wafer using the engagement head 213. After the wafer is engaged by the transfer unit, the head is operated to release the wafer by operating the wafer support fingers 334 into expanded positions, as explained more fully above. The wafer is then removed from the chemical processor unit 300 and transferred to the radiative volatilization processing unit 400.

The wafer is inserted by the transfer unit into a treatment position within the protective vessel 430 resting upon stands 433. The wafer engagement tool is then retracted and the infrared or other desired radiation emitting lamps 440 are turned on to beam upon the surface of the wafer for times as indicated hereinabove. After the wafer has been sufficiently treated by the radiative treatment subsystem 400, then the robotic transfer unit 210 is used to remove the wafer from vessel 430 and relocate it to the wafer inventory 205 or on to another piece of processing equipment (not shown).

In compliance with the statute, the invention has been described in language more or less specific as to structural features. It is to be understood, however, that the invention is not limited to the specific features shown, since the means and construction herein disclosed comprise a preferred form or putting the invention into effect. The invention is, therefore, claimed in any of its forms or modifications within the proper scope of the appended claims appropriately interpreted in accordance with the doctrine of equivalents.

I claim:

1. A process for etching semiconductor wafers using hydrofluoric acid vapor, comprising:
    containing a wafer within a substantially enclosed processing chamber;
    providing a liquid etchant source within the substantially enclosed processing chamber; said liquid etchant source including at least hydrofluoric acid and water;
    producing a substantially homogeneous vapor mixture from the liquid etchant source; said substantially homogeneous vapor mixture including at least hydrofluoric acid vapor and water vapor to provide a homogeneous etchant gas; said producing being accomplished within a liquid phase chemical chamber forming a part of the processing chamber;
    contacting the homogeneous etchant gas against at least one processed surface of the wafer which is to be etched;
    rotating the wafer in juxtaposition to the liquid etchant source at a desired rotational speed;
    enhancing circulation and transfer of homogeneous etchant gas from the liquid source to the at least one processed surface of the wafer surface by rotating a member within the processing chamber;
    terminating fluid communication between said liquid phase chemical chamber and remaining portions of said processing chamber wherein the wafer is held and rotated by partitioning the processing chamber using a movable wall structure.

2. A process according to claim 1 and further comprising:
    exhausting said homogeneous etchant gas from said remaining portions of said processing chamber to retard further etching of the wafer after said terminating.

3. A process for etching semiconductor wafers using hydrofluoric acid vapor, comprising:
    containing a wafer within a substantially enclosed processing chamber;
    providing a liquid etchant source within the substantially enclosed processing chamber; said liquid etchant source including at least hydrofluoric acid and water;
    producing a substantially homogeneous vapor mixture from the liquid etchant source; said substantially homogeneous vapor mixture including at least hydrofluoric acid vapor and water vapor to provide a homogeneous etchant gas; said producing being accomplished within a liquid phase chemical chamber forming a part of the processing chamber;
    contacting the homogeneous etchant gas against at least one processed surface of the wafer which is to be etched;
    rotating the wafer in juxtaposition to the liquid etchant source at a desired rotational speed;
    enhancing circulation and transfer of homogeneous etchant gas from the liquid source to the at least one processed surface of the wafer surface by rotating a member within the processing chamber;
    agitating the liquid etchant source to aid in said producing step;
    controllably placing said liquid phase chemical chamber in fluid communication with remaining portions of said processing chamber in which the wafer is held and rotated to allow vapors from agitated liquid etchant source to pass from the liquid phase chemical chamber to said remaining portions of said processing chamber.

4. A process according to claim 3 wherein said agitating is accomplished at least in part by stirring and mixing liquid etchant source to create turbulence and also maintain homogeneity thereof.

5. A process according to claim 3 wherein said agitating is accomplished at least in part by recirculating liquid etchant source through the liquid phase chemical chamber to create turbulence and also maintain homogeneity thereof.

6. A process for etching semiconductor wafers using hydrofluoric acid vapor, comprising:
    containing a wafer within a substantially enclosed processing chamber;
    providing a liquid etchant source within the substantially enclosed processing chamber; said liquid etchant source including at least hydrofluoric acid and water;
    producing a substantially homogeneous vapor mixture from the liquid etchant source; said substantially homogeneous vapor mixture including at least hydrofluoric acid vapor and water vapor to provide a homogeneous etchant gas; said producing being accomplished within an annular liquid phase chemical chamber forming a part of the processing chamber;
    contacting the homogeneous etchant gas against at least one processed surface of the wafer which is to be etched;
    rotating the wafer in juxtaposition to the liquid etchant source at a desired rotational speed;
    enhancing circulation and transfer of homogeneous etchant gas from the liquid source to the at least one processed surface of the wafer surface by rotating a member within the processing chamber;

controllably placing said liquid phase chemical chamber in fluid communication with remaining portions of said processing chamber wherein the wafer is held and rotated to allow vapors from a liquid etchant source to pass from the liquid phase chemical chamber to said remaining portions of said processing chamber.

7. A process according to claim 6 wherein said controllably placing said liquid phase chemical chamber in fluid communication with remaining portions of said processing chamber wherein the wafer is held and rotated is accomplished by controllably moving a wall of said processing chamber to allow vapors from the liquid etchant source to pass from the liquid phase chemical chamber to said remaining portions of said processing chamber.

8. A process according to claim 6 wherein said controllably placing said liquid phase chemical chamber in fluid communication with remaining portions of said processing chamber wherein the wafer is held and rotated is accomplished by controllably moving a partition wall of said processing chamber to allow vapors from a liquid etchant source to pass from the liquid phase chemical chamber to said processing chamber.

9. A process for etching semiconductor wafers using hydrofluoric acid vapor, comprising:
containing a wafer within a substantially enclosed processing chamber;
providing a liquid etchant source within the substantially enclosed processing chamber; said liquid etchant source including at least hydrofluoric acid and water;
producing a substantially homogeneous vapor mixture from the liquid etchant source; said substantially homogeneous vapor mixture including at least hydrofluoric acid vapor and water vapor to provide a homogeneous etchant gas;
contacting the homogeneous etchant gas against at least one processed surface of the wafer which is to be etched;
rotating the wafer in juxtaposition to the liquid etchant source at a desired rotational speed;
enhancing circulation and transfer of homogeneous etchant gas from the liquid source to the at least one processed surface of the wafer surface by rotating a member within the processing chamber;
heating the wafer to remove particulate therefrom.

10. A process according to claim 9 wherein said heating the wafer serves to remove particulate by-products deposited upon the wafer from said contacting step.

11. A process for etching semiconductor wafers using hydrofluoric acid vapor, comprising:
containing a wafer within a substantially enclosed processing chamber;
providing a liquid etchant source within the substantially enclosed processing chamber; said liquid etchant source including at least hydrofluoric acid and water;
producing a substantially homogeneous vapor mixture from the liquid etchant source; said substantially homogeneous vapor mixture including at least hydrofluoric acid vapor and water vapor to provide a homogeneous etchant gas;
contacting the homogeneous etchant gas against at least one processed surface of the wafer which is to be etched;
rotating the wafer in juxtaposition to the liquid etchant source at a desired rotational speed;
enhancing circulation and transfer of homogeneous etchant gas from the liquid source to the at least one processed surface of the wafer surface by rotating a member within the processing chamber;
beaming radiant energy upon the wafer to remove particulate therefrom.

12. A process according to claim 11 wherein said beaming is predominantly infrared radiant energy.

13. A process for etching semiconductor wafers using hydrofluoric acid vapor, comprising:
containing a wafer within a substantially enclosed processing chamber;
providing a liquid etchant source within the substantially enclosed processing chamber; said liquid etchant source including at least hydrofluoric acid and water;
producing a substantially homogeneous vapor mixture from the liquid etchant source; said substantially homogeneous vapor mixture including at least hydrofluoric acid vapor and water vapor to provide a homogeneous etchant gas;
contacting the homogeneous etchant gas against at least one processed surface of the wafer which is to be etched;
rotating the wafer in juxtaposition to the liquid etchant source at a desired rotational speed;
enhancing circulation and transfer of homogeneous etchant gas from the liquid source to the at least one processed surface of the wafer surface by rotating a member within the processing chamber;
controlling to effect temperature of the homogeneous etchant gas.

14. A process according to claim 13 wherein said controlling to effect temperature of the homogeneous etchant gas is performed so as to maintain temperatures in the approximate range 10°–100° C.

15. A process for etching semiconductor wafers using hydrofluoric acid vapor, comprising:
containing a wafer within a substantially enclosed processing chamber;
providing a liquid etchant source within the substantially enclosed processing chamber; said liquid etchant source including at least hydrofluoric acid and water;
producing a substantially homogeneous vapor mixture from the liquid etchant source; said substantially homogeneous vapor mixture including at least hydrofluoric acid vapor and water vapor to provide a homogeneous etchant gas; said producing being accomplished within a liquid phase chemical chamber forming a part of the processing chamber;
contacting the homogeneous etchant gas against at least one processed surface of the wafer which is to be etched;
rotating the wafer in juxtaposition to the liquid etchant source at a desired rotational speed; said rotating being accomplished while orienting the wafer with the processed surface downwardly in proximity to said liquid etchant source;
enhancing circulation and transfer of homogeneous etchant gas from the liquid source to the at least one processed surface of the wafer surface by rotating a member within the processing chamber;
controllably placing said liquid phase chemical chamber in fluid communication with remaining portions of said processing chamber wherein the wafer is held and rotated to allow vapors from the liquid etchant source to pass from the liquid phase chemical chamber to said remaining portions of said processing chamber.

16. A process according to claim 15 and further comprising:
   agitating the liquid etchant source to aid in said producing step.

17. A process according to claim 16 wherein said agitating is accomplished at least in part by stirring and mixing liquid etchant source to create turbulence and also maintain homogeneity thereof.

18. A process according to claim 16 wherein said agitating is accomplished at least in part by recirculating liquid etchant source through the liquid phase chemical chamber to create turbulence and also maintain homogeneity thereof.

19. A process according to claim 15 and further comprising terminating fluid communication between said liquid phase chemical chamber and said processing chamber by partitioning the processing chamber using a movable wall structure.

20. A process according to claim 15 and further comprising:
   terminating fluid communication between said liquid phase chemical chamber and said remaining portions of said processing chamber;
   exhausting said homogeneous etchant gas from said remaining portions of said processing chamber to retard further etching of the wafer.

21. A process for etching semiconductor wafers using hydrofluoric acid vapor, comprising:
   containing a wafer within a substantially enclosed processing chamber;
   providing a liquid etchant source within the substantially enclosed processing chamber; said liquid etchant source including at least hydrofluoric acid and water;
   producing a substantially homogeneous vapor mixture from the liquid etchant source; said substantially homogeneous vapor mixture including at least hydrofluoric acid vapor and water vapor to provide a homogeneous etchant gas: said producing being accomplished within an annular liquid phase chemical chamber forming a part of the processing chamber;
   contacting the homogeneous etchant gas against at least one processed surface of the wafer which is to be etched;
   rotating the wafer in juxtaposition to the liquid etchant source at a desired rotational speed; said rotating being accomplished while orienting the wafer with the processed surface downwardly in proximity to said liquid etchant source;
   enhancing circulation and transfer of homogeneous etchant gas from the liquid source to the at least one processed surface of the wafer surface by rotating a member within the processing chamber;
   controllably placing said liquid phase chemical chamber in fluid communication with remaining portions of said processing chamber wherein the wafer is held and rotated to allow vapors from a liquid etchant source to pass from the liquid phase chemical chamber to said remaining portions of said processing chamber.

22. A process for etching semiconductor wafers using hydrofluoric acid vapor, comprising:
   containing a wafer within a substantially enclosed processing chamber;
   providing a liquid etchant source within the substantially enclosed processing chamber; said liquid etchant source including at least hydrofluoric acid and water;
   producing a substantially homogeneous vapor mixture from the liquid etchant source; said substantially homogeneous vapor mixture including at least hydrofluoric acid vapor and water vapor to provide a homogeneous etchant gas; said producing being accomplished within a liquid phase chemical chamber forming a part of the processing chamber;
   contacting the homogeneous etchant gas against at least one processed surface of the wafer which is to be etched;
   rotating the wafer in juxtaposition to the liquid etchant source at a desired rotational speed; said rotating being accomplished while orienting the wafer with the processed surface downwardly in proximity to said liquid etchant source;
   enhancing circulation and transfer of homogeneous etchant gas from the liquid source to the at least one processed surface of the wafer surface by rotating a member within the processing chamber;
   controllably placing said liquid phase chemical chamber in fluid communication with remaining portions of said processing chamber wherein the wafer is held and rotated by controllably moving a wall of said processing chamber to allow vapors from the liquid etchant source to pass from the liquid phase chemical chamber to said remaining portions of said processing chamber.

23. A process for etching semiconductor wafers using hydrofluoric acid vapor, comprising:
   containing a wafer within a substantially enclosed processing chamber;
   providing a liquid etchant source within the substantially enclosed processing chamber; said liquid etchant source including at least hydrofluoric acid and water;
   producing a substantially homogeneous vapor mixture from the liquid etchant source; said substantially homogeneous vapor mixture including at least hydrofluoric acid vapor and water vapor to provide a homogeneous etchant gas; said producing being accomplished within a liquid phase chemical chamber forming a part of the processing chamber;
   contacting the homogeneous etchant gas against at least one processed surface of the wafer which is to be etched;
   rotating the wafer in juxtaposition to the liquid etchant source at a desired rotational speed; said rotating being accomplished while orienting the wafer with the processed surface downwardly in proximity to said liquid etchant source;
   enhancing circulation and transfer of homogeneous etchant gas from the liquid source to the at least one processed surface of the wafer surface by rotating a member within the processing chamber;
   controllably placing said liquid phase chemical chamber in fluid communication with remaining portions of said processing chamber wherein the wafer is held and rotated by controllably moving a bottom wall of said processing chamber to allow vapors from the liquid etchant source to pass from the liquid phase chemical chamber to said remaining portions of said processing chamber.

24. A process for etching semiconductor wafers using hydrofluoric acid vapor, comprising:
  containing a wafer within a substantially enclosed processing chamber;
  providing a liquid etchant source within the substantially enclosed processing chamber; said liquid etchant source including at least hydrofluoric acid and water;
  producing a substantially homogeneous vapor mixture from the liquid etchant source; said substantially homogeneous vapor mixture including at least hydrofluoric acid vapor and water vapor to provide a homogeneous etchant gas;
  contacting the homogeneous etchant gas against at least one processed surface of the wafer which is to be etched;
  rotating the wafer in juxtaposition to the liquid etchant source at a desired rotational speed; said rotating being accomplished while orienting the wafer with the processed surface downwardly in proximity to said liquid etchant source;
  enhancing circulation and transfer of homogeneous etchant gas from the liquid source to the at least one processed surface of the wafer surface by rotating a member within the processing chamber;
  heating the wafer to remove particulate therefrom.

25. A process according to claim 24 wherein said heating the wafer is to remove particulate by-products deposited upon the wafer from said contacting step.

26. A process for etching semiconductor wafers using hydrofluoric acid vapor, comprising:
  containing a wafer within a substantially enclosed processing chamber;
  providing a liquid etchant source within the substantially enclosed processing chamber; said liquid etchant source including at least hydrofluoric acid and water;
  producing a substantially homogeneous vapor mixture from the liquid etchant source; said substantially homogeneous vapor mixture including at least hydrofluoric acid vapor and water vapor to provide a homogeneous etchant gas;
  contacting the homogeneous etchant gas against at least one processed surface of the wafer which is to be etched;
  rotating the wafer in juxtaposition to the liquid etchant source at a desired rotational speed; said rotating being accomplished while orienting the wafer with the processed surface downwardly in proximity to said liquid etchant source;
  enhancing circulation and transfer of homogeneous etchant gas from the liquid source to the at least one processed surface of the wafer surface by rotating a member within the processing chamber;
  beaming radiant energy upon the wafer to remove particulate therefrom.

27. A process according to claim 26 wherein said beaming is accomplished using predominantly infrared radiant energy.

28. A process for etching semiconductor wafers using hydrofluoric acid vapor, comprising:
  containing a wafer within a substantially enclosed processing chamber;
  providing a liquid etchant source within the substantially enclosed processing chamber; said liquid etchant source including at least hydrofluoric acid and water;
  producing a substantially homogeneous vapor mixture from the liquid etchant source; said substantially homogeneous vapor mixture including at least hydrofluoric acid vapor and water vapor to provide a homogeneous etchant gas;
  contacting the homogeneous etchant gas against at least one processed surface of the wafer which is to be etched;
  rotating the wafer in juxtaposition to the liquid etchant source at a desired rotational speed; said rotating being accomplished while orienting the wafer with the processed surface downwardly in proximity to said liquid etchant source;
  enhancing circulation and transfer of homogeneous etchant gas from the liquid source to the at least one processed surface of the wafer surface by rotating a member within the processing chamber;
  controlling to effect temperature of the homogeneous etchant gas.

29. A process according to claim 28 wherein said controlling is to effect temperature of the homogeneous etchant gas to maintain temperatures in the approximate range 10°–100° C.

30. A process for etching semiconductor wafers using hydrofluoric acid vapor, comprising:
  containing a wafer within a substantially enclosed processing chamber;
  providing a liquid etchant source within the substantially enclosed processing chamber; said liquid etchant source including at least hydrofluoric acid and water;
  producing a substantially homogeneous vapor mixture from the liquid etchant source; said substantially homogeneous vapor mixture including at least hydrofluoric acid vapor and water vapor to provide a homogeneous etchant gas;
  contacting the homogeneous etchant gas against at least one processed surface of the wafer which is to be etched;
  rotating the wafer in juxtaposition to the liquid etchant source at a desired rotational speed; said rotating being accomplished while orienting the wafer with the processed surface downwardly in proximity to said liquid etchant source;
  enhancing circulation and transfer of homogeneous etchant gas from the liquid source to the at least one processed surface of the wafer surface by rotating a member within the processing chamber;
  said homogeneous liquid etchant source being continuously recirculated and filtered.

31. A process for etching semiconductor wafers using hydrofluoric acid vapor, comprising:
  containing a wafer within a substantially enclosed processing chamber;
  providing a liquid etchant source within the substantially enclosed processing chamber; said liquid etchant source including at least hydrofluoric acid and water; said providing being accomplished by forming a pool of liquid etchant source beneath a wafer being processed; said providing being accomplished by forming a toroidal pool of liquid etchant source adjacent to a wafer being processed;
  producing a substantially homogeneous vapor mixture from the liquid etchant source; said substantially homogeneous vapor mixture including at least hydrofluoric acid vapor and water vapor to provide a homogeneous etchant gas;

contacting the homogeneous etchant gas against at least one processed surface of the wafer which is to be etched;

rotating the wafer in juxtaposition to the liquid etchant source at a desired rotational speed;

enhancing circulation and transfer of homogeneous etchant gas from the liquid source to the at least one processed surface of the wafer surface by rotating a member within the processing chamber; orienting the wafer with the processed surface downwardly in proximity to the toroidal pool of liquid etchant source.

32. A process according to claim 31 wherein said wafer is positioned within a proximity range of approximately 2–100 millimeters from the liquid etchant source to portions of the processed surface of the wafer.

33. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

terminating fluid communication between said liquid phase chemical chamber and remaining portions of said processing chamber wherein the wafer is held and spun by partitioning the processing chamber using a movable wall structure.

34. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

terminating fluid communication between said liquid phase chemical chamber and said processing chamber;

exhausting said homogeneous vapor mixture from said processing chamber to retard further processing of the wafer.

35. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

terminating fluid communication between said liquid phase chemical chamber and remaining portions of said processing chamber wherein the wafer is held and spun by partitioning the processing chamber using a movable wall structure;

exhausting said homogeneous processing gas from said remaining portions of said processing chamber to retard further processing of the wafer after said terminating.

36. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

agitating the liquid processing fluid source to aid in said producing step;

controllably placing said liquid phase chemical chamber in fluid communication with remaining portions of said processing chamber in which the wafer is held and spun to allow vapors from agitated liquid processing fluid source to pass from the liquid phase chemical chamber to said remaining portions of said processing chamber.

37. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber; said providing a pool being accomplished by forming a toroidal pool adjacent to a wafer being processed;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin.

38. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas, said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing .gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

wherein said producing is accomplished within an annular liquid phase chemical chamber forming a part of the processing chamber; and further comprising controllably placing said liquid phase chemical chamber in fluid communication with remaining portions of said processing chamber wherein the wafer is held and spun to allow vapors from a liquid processing fluid source to pass from the liquid phase chemical chamber to said remaining portions of said processing chamber.

39. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

wherein said producing is accomplished within a liquid phase chemical chamber forming a part of the processing chamber; and further comprising controllably placing said liquid phase chemical chamber in fluid communication with remaining portions of said processing chamber wherein the wafer is held and spun by controllably moving a wall of said processing chamber to allow vapors from the liquid processing fluid source to pass from the liquid phase chemical chamber to said remaining portions of said processing chamber.

40. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

controllably placing said liquid phase chemical chamber in fluid communication with remaining portions of said processing chamber wherein the wafer is held and spun by controllably moving a partition wall of said processing chamber to allow vapors from a liquid processing fluid source to pass from the liquid phase chemical chamber to said processing chamber.

41. A process for vapor processing semiconductor wafers, comprising:
- containing a wafer within a substantially enclosed processing chamber;
- producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;
- contacting the substantially homogeneous processing gas against a processed surface of the wafer which is to be processed;
- spinning the wafer to provide uniform dispersion of the substantially homogeneous processing gas across the wafer surface and to facilitate circulation and transfer of the substantially homogeneous processing gas to the processed surface;
- enhancing production of said vapor mixture from said pool of liquid processing fluid source by spinning a member within the enclosed processing chamber to effect circulation of gases therewithin;
- controllably placing said liquid phase chemical chamber in fluid communication with said enclosed processing chamber by controllably moving a bottom wall of said enclosed processing chamber to allow vapors from a liquid processing fluid source to pass from the liquid phase chemical chamber to said processing chamber.

42. A process for vapor processing semiconductor wafers, comprising:
- containing a wafer within a substantially enclosed processing chamber;
- producing a substantially homogeneous vapor mixture having a reactant vapor and a diluent vapor to provide a substantially homogeneous processing gas: said producing a substantially homogeneous vapor mixture being accomplished by providing a pool of liquid processing fluid source within a liquid phase chemical chamber forming a part of the processing chamber;
- contacting the substantially homogeneous processing gas against a processed surface of the wafer which is to be processed;
- spinning the wafer to provide uniform dispersion of the substantially homogeneous processing gas across the wafer surface and to facilitate circulation and transfer of the substantially homogeneous processing gas to the processed surface;
- enhancing production of said vapor mixture from said pool of liquid processing fluid source by spinning a member within the enclosed processing chamber to effect circulation of gases therewithin;
- placing said liquid phase chemical chamber in fluid communication with said enclosed processing chamber by controllably opening a vapor phase control valve to allow vapors from a liquid processing fluid source to pass from the liquid phase chemical chamber to said processing chamber.

43. A process for vapor processing semiconductor wafers, comprising:
- containing a wafer within a substantially enclosed processing chamber;
- producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;
- contacting the substantially homogeneous processing gas against a processed surface of the wafer which is to be processed;
- spinning the wafer to provide uniform dispersion of the substantially homogeneous processing gas across the wafer surface and to facilitate circulation and transfer of the substantially homogeneous processing gas to the processed surface;
- enhancing production of said vapor mixture from said pool of liquid processing fluid source by spinning a member within the enclosed processing chamber to effect circulation of gases therewithin;
- wherein said producing is accomplished within an annular liquid phase chemical chamber; and further comprising placing said liquid phase chemical chamber in fluid communication with said enclosed processing chamber by controllably opening a vapor phase control valve serving as a wall of the enclosed processing chamber to allow vapors from a liquid processing fluid source to pass from the liquid phase chemical chamber to said processing chamber.

44. A process according to claim 43 and further comprising:
- closing said vapor phase control valve;
- exhausting homogeneous vapor mixture from said processing chamber to retard further processing of the wafer.

45. A process for vapor processing semiconductor wafers, comprising:
- containing a wafer within a substantially enclosed processing chamber;
- producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming, a part of the processing chamber;
- contacting the substantially homogeneous processing gas against a processed surface of the wafer which is to be processed;
- spinning the wafer to provide uniform dispersion of the substantially homogeneous processing gas across the wafer surface and to facilitate circulation and transfer of the substantially homogeneous processing gas to the processed surface;
- enhancing production of said vapor mixture from said pool of liquid processing fluid source by spinning a member within the enclosed processing chamber to effect circulation of gases therewithin;
- heating the wafer to remove particulate therefrom.

46. A process for vapor processing semiconductor wafers, comprising:
- containing a wafer within a substantially enclosed processing chamber;
- producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber forming a part of the processing chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said pool of liquid processing fluid source by spinning a member within the enclosed processing chamber to effect circulation of gases therewithin;

beaming radiant energy upon the wafer to remove particulate therefrom.

47. A process for vapor processing semiconductor wafers, comprising:

containing a wafer within a substantially enclosed processing chamber;

producing a substantially homogeneous vapor mixture having a reactant vapor and a diluent vapor to provide a substantially homogeneous processing gas; said producing a substantially homogeneous vapor mixture being accomplished by providing a pool of liquid processing fluid source within a liquid phase chemical chamber;

contacting the substantially homogeneous processing gas against a processed surface of the wafer which is to be processed;

spinning the wafer to provide uniform dispersion of the substantially homogeneous processing gas across the wafer surface and to facilitate circulation and transfer of the substantially homogeneous processing gas to the processed surface;

enhancing production of said vapor mixture from said liquid processing fluid source by spinning a member within the enclosed processing chamber to effect circulation of gases therewithin and against the liquid processing fluid source.

48. A process according to claim 47 wherein said wafer is positioned within a proximity range of approximately 2-100 millimeters from the liquid processing fluid source to portions of the processed surface of the wafer.

49. A process according to claim 47 and further comprising terminating fluid communication between said liquid phase chemical chamber and portions of said processing chamber wherein the wafer is held and spun by partitioning the processing chamber using a movable wall structure.

50. A process according to claim 47 and further comprising:

terminating fluid communication between said liquid phase chemical chamber and said processing chamber;

exhausting said homogeneous vapor mixture from said processing chamber to retard further processing of the wafer.

51. A process according to claim 47 and further comprising:

terminating fluid communication between said liquid phase chemical chamber and remaining portions of said processing chamber wherein the wafer is held and spun by partitioning the processing chamber using a movable wall structure;

exhausting said homogeneous processing gas from said remaining portions of processing chamber to retard further processing of the wafer after said terminating.

52. A process according to claim 47 and further comprising:

agitating the liquid processing fluid source to aid in said producing step;

controllably placing said liquid phase chemical chamber in fluid communication with remaining portions of said processing chamber in which the wafer is held and spun to allow vapors from agitated liquid processing fluid source to pass from the liquid phase chemical chamber to said remaining portions of said processing chamber.

53. A process according to claim 47 wherein said spinning the wafer is at speeds in the approximate range of 20-1000 revolutions per minute.

54. A process according to claim 47 wherein said spinning the wafer the wafer is accomplished with said processed surface downwardly in proximity to said liquid processing fluid source.

55. A process according to claim 54 wherein said spinning the wafer is at speeds in the approximate range of 20-1000 revolutions per minute.

56. A process according to claim 47 wherein said providing a pool is accomplished by forming a toroidal pool adjacent to a wafer being processed.

57. A process according to claim 47 wherein said providing a pool is accomplished by forming a toroidal pool adjacent to a wafer being processed; and further defined by orienting said processed surface downwardly in proximity to the toroidal pool of liquid processing fluid source.

58. A process according to claim 47 and further comprising agitating the pool of liquid processing fluid source.

59. A process according to claim 47 and further comprising ultrasonically agitating the pool of liquid processing fluid source.

60. A process according to claim 47 and further comprising drying the wafer within the processing chamber.

61. A process according to claim 47 wherein said producing is accomplished within an annular liquid phase chemical chamber forming a part of the processing chamber; and further comprising controllably placing said liquid phase chemical chamber in fluid communication with remaining portions of said processing chamber wherein the wafer is held and spun to allow vapors from a liquid processing fluid source to pass from the liquid phase chemical chamber to said remaining portions of said processing chamber.

62. A process according to claim 47 wherein said producing is accomplished within a liquid phase chemical chamber forming a part of the processing chamber; and further comprising controllably placing said liquid phase chemical chamber in fluid communication with remaining portions of said processing chamber wherein the wafer is held and spun by controllably moving a wall of said processing chamber to allow vapors from the liquid processing fluid source to pass from the liquid phase chemical chamber to said remaining portions of said processing chamber.

63. A process according to claim 47 and further comprising controllably placing said liquid phase chemical chamber in fluid communication with remaining portions of said processing chamber wherein the wafer is held and spun by controllably moving a partition wall of said processing chamber to allow vapors from a liquid processing fluid source to pass from the liquid phase chemical chamber to said processing chamber.

64. A princess according to claim 47 and further comprising controllably placing said liquid phase chemical chamber in fluid communication with said enclosed processing chamber by controllably moving a bottom wall of said enclosed processing chamber to allow vapors from a liquid processing fluid source to pass from the liquid phase chemical chamber to said processing chamber.

65. A process according to claim 47 and further comprising placing said liquid phase chemical chamber in fluid communication with said enclosed processing chamber by controllably opening a vapor phase control valve to allow vapors from a liquid processing fluid source to pass from the liquid phase chemical chamber to said processing chamber.

66. A process according to claim 47 wherein said producing is accomplished within an annular liquid phase chemical chamber; and further comprising placing said liquid phase chemical chamber in fluid communication with said enclosed processing chamber by controllably opening a vapor phase control valve serving as a wall of the enclosed processing chamber to allow vapors from a liquid processing fluid source to pass from the liquid phase chemical chamber to said processing chamber.

67. A process according to claim 66 and further comprising:
  closing said vapor phase control valve;
  exhausting homogeneous vapor mixture from said processing chamber to retard further processing of the wafer.

68. A process according to claim 47 and further comprising heating the wafer to remove particulate therefrom.

69. A process according to claim 47 and further comprising beaming radiant energy upon the wafer to remove particulate therefrom.

* * * * *